(12) United States Patent
Cao et al.

(10) Patent No.: US 11,733,407 B2
(45) Date of Patent: Aug. 22, 2023

(54) METHODS OF MAKING A RADIATION DETECTOR

(71) Applicant: SHENZHEN XPECTVISION TECHNOLOGY CO., LTD., Shenzhen (CN)

(72) Inventors: Peiyan Cao, Shenzhen (CN); Yurun Liu, Shenzhen (CN)

(73) Assignee: SHENZHEN XPECTVISION TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/684,787

(22) Filed: Mar. 2, 2022

(65) Prior Publication Data

US 2022/0187482 A1 Jun. 16, 2022

Related U.S. Application Data

(60) Division of application No. 16/919,565, filed on Jul. 2, 2020, now Pat. No. 11,294,080, which is a continuation of application No. PCT/CN2018/074046, filed on Jan. 24, 2018.

(51) Int. Cl.
*G01T 1/24* (2006.01)
*H01L 27/146* (2006.01)

(52) U.S. Cl.
CPC .......... *G01T 1/247* (2013.01); *H01L 27/1469* (2013.01); *H01L 27/14659* (2013.01); *H01L 27/14661* (2013.01); *H01L 27/14689* (2013.01)

(58) Field of Classification Search
CPC ..... G01T 1/247; G01T 1/20182; G01T 1/243; G01T 1/2928; H01L 27/14659; H01L 27/14661; H01L 27/14689; H01L 27/1469
See application file for complete search history.

(56) References Cited

U.S. PATENT DOCUMENTS

| 2014/0217562 | A1 | 8/2014 | Schmidt |
| 2016/0356901 | A1 | 12/2016 | Shao et al. |
| 2018/0337204 | A1* | 11/2018 | Bakowski Holtryd ...... H01L 27/14658 |

FOREIGN PATENT DOCUMENTS

| TW | 201713966 A | 4/2017 |
| TW | 201730583 A | 9/2017 |

* cited by examiner

*Primary Examiner* — Kiho Kim
(74) *Attorney, Agent, or Firm* — IPro, PLLC; Qian Gu

(57) ABSTRACT

Disclosed herein is a method for forming a radiation detector. The method comprises forming a radiation absorption layer and bonding an electronics layer to the radiation absorption layer. The electronics layer comprises an electronic system configured to process electrical signals generated in the radiation absorption layer upon absorbing radiation photons. The method for forming the radiation absorption layer comprises forming a trench into a first surface of a semiconductor substrate; doping a sidewall of the trench; forming a first electrical contact on the first surface; forming a second electrical contact on a second surface of the semiconductor substrate. The second surface is opposite the first surface. The method further comprises dicing the semiconductor substrate along the trench.

12 Claims, 22 Drawing Sheets

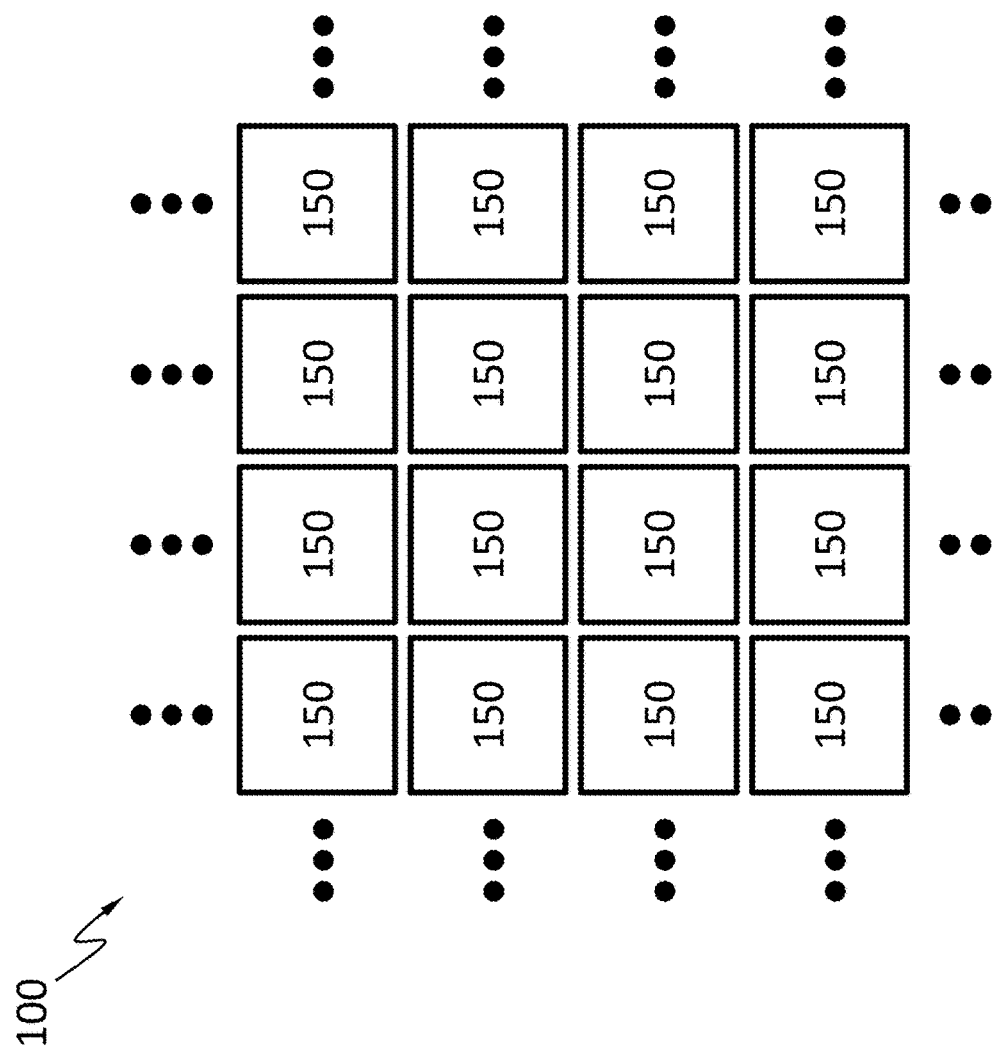

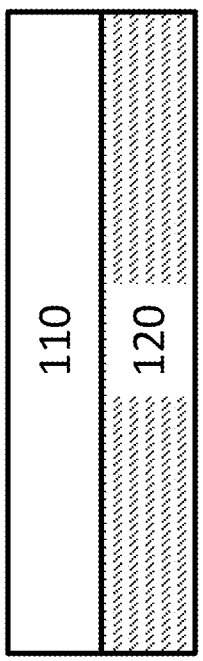
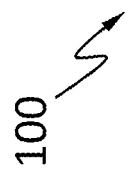
Fig. 2A

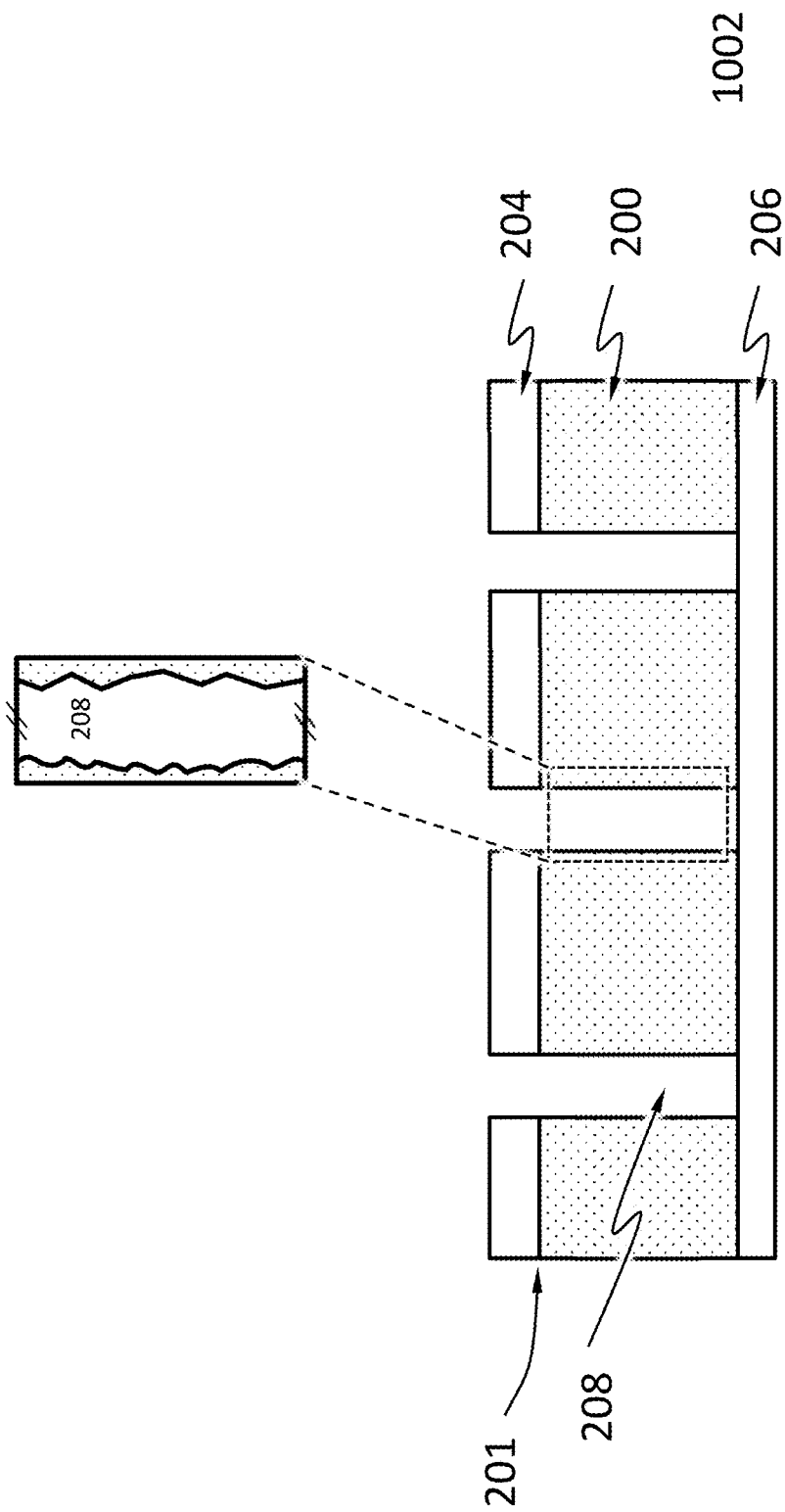

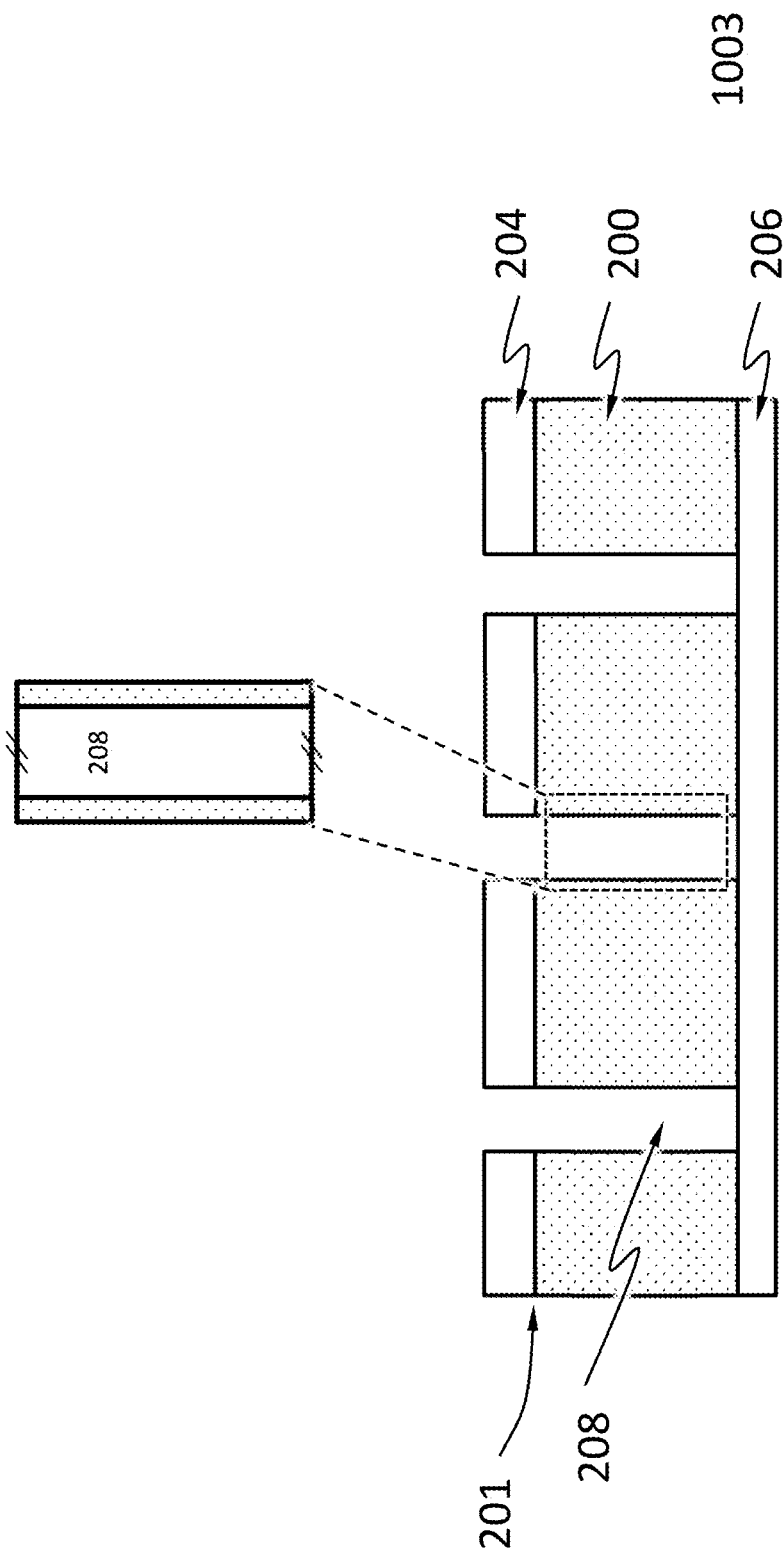

METHODS OF MAKING A RADIATION DETECTOR

TECHNICAL FIELD

The disclosure herein relates to methods of making a radiation detector, particularly relates to a method of forming a radiation detector with an active edge.

BACKGROUND

A radiation detector is a device that measures a property of a radiation. Examples of the property may include a spatial distribution of the intensity, phase, and polarization of the radiation. The radiation may be one that has interacted with a subject. For example, the radiation measured by the radiation detector may be a radiation that has penetrated or reflected from the subject. The radiation may be an electromagnetic radiation such as infrared light, visible light, ultraviolet light, X-ray or γ-ray. The radiation may be of other types such as α-rays and β-rays.

One type of radiation detectors is based on interaction between the radiation and a semiconductor. For example, a radiation detector of this type may have a semiconductor layer that absorbs the radiation and generate charge carriers (e.g., electrons and holes) and circuitry for detecting the charge carriers.

SUMMARY

Disclosed herein is a method comprising: forming a trench into a first surface of a semiconductor substrate; doping a sidewall of the trench; forming a first electrical contact on the first surface; forming a second electrical contact on a second surface of the semiconductor substrate, the second surface being opposite the first surface.

According to an embodiment, the semiconductor substrate comprises silicon, germanium, GaAs, CdTe, CdZnTe, or a combination thereof.

According to an embodiment, the trench extends through an entire thickness of the semiconductor substrate.

According to an embodiment, forming the trench comprises forming a mask on the first surface and etching portions of the semiconductor substrate uncovered by the mask.

According to an embodiment, the mask comprises silicon dioxide.

According to an embodiment, forming the trench comprises deep reactive-ion etching.

According to an embodiment, the method further comprises smoothening the sidewall by wet etching.

According to an embodiment, doping the sidewall comprises diffusing gaseous dopant into the sidewall.

According to an embodiment, doping the sidewall comprises depositing polysilicon into the trench.

According to an embodiment, the method further comprises doping the polysilicon after depositing the polysilicon.

According to an embodiment, doping the sidewall comprises annealing the semiconductor substrate.

According to an embodiment, the second electrical contact comprises discrete portions.

According to an embodiment, the method further comprises forming a diode in the semiconductor substrate by forming a first doped region into the first surface and a second doped region into the second surface.

According to an embodiment, the second doped region comprises discrete regions.

According to an embodiment, the first doped region and the sidewall have a same type of doping.

According to an embodiment, the second doped region and the first doped region have opposite types of doping.

According to an embodiment, the method further comprises dicing the semiconductor substrate along the trench.

According to an embodiment, the method further comprises bonding the semiconductor substrate to another substrate comprising an electronic system therein or thereon.

According to an embodiment, the electronic system comprises a voltage comparator configured to compare a voltage of the second electrical contact to a first threshold; a counter configured to register a number of photons of radiation absorbed by the radiation absorption layer; a controller; a voltmeter; wherein the controller is configured to start a time delay from a time at which the voltage comparator determines that an absolute value of the voltage equals or exceeds an absolute value of the first threshold; wherein the controller is configured to cause the voltmeter to measure the voltage upon expiration of the time delay; wherein the controller is configured to determine a number of photons by dividing the voltage measured by the voltmeter by a voltage that a single photon would have caused on the second electrical contact; wherein the controller is configured to cause the number registered by the counter to increase by the number of photons.

According to an embodiment, the electronic system further comprising a capacitor module electrically connected to the second electrical contact, wherein the capacitor module is configured to collect charge carriers from the second electrical contact.

According to an embodiment, the controller is configured to connect the second electrical contact to an electrical ground.

According to an embodiment, the controller is configured to deactivate the voltage comparator at a beginning of the time delay.

Disclosed herein is a detector comprising: a radiation absorption layer comprising a first surface, a first electrical contact on the first surface, a second surface opposite the first surface, a second electrical contact on the second surface, and a sidewall; wherein the sidewall is doped; an electronics layer bonded to the radiation absorption layer, the electronics layer comprising electronic system configured to process electrical signals on the second electrical contact.

According to an embodiment, the radiation absorption layer comprises silicon, germanium, GaAs, CdTe, CdZnTe, or a combination thereof.

According to an embodiment, the second electrical contact comprises discrete portions.

According to an embodiment, the sidewall is the only doped sidewall of the radiation absorption layer.

According to an embodiment, the radiation absorption layer comprises a diode comprising a first doped region and a second doped region, wherein the first doped region and the second doped region are in the first surface and the second surface respectively.

According to an embodiment, the second doped region comprises discrete regions.

According to an embodiment, the first doped region and the sidewall have a same type of doping.

According to an embodiment, the first doped region and the second doped region have opposite types of doping.

According to an embodiment, the electronic system comprises a voltage comparator configured to compare a voltage of the second electrical contact to a first threshold; a counter configured to register a number of photons of radiation absorbed by the semiconductor substrate; a controller; a voltmeter; wherein the controller is configured to start a time delay from a time at which the voltage comparator determines that an absolute value of the voltage equals or exceeds an absolute value of the first threshold; wherein the controller is configured to cause the voltmeter to measure the voltage upon expiration of the time delay; wherein the controller is configured to determine a number of photons by dividing the voltage measured by the voltmeter by a voltage that a single photon would have caused on the second electrical contact; wherein the controller is configured to cause the number registered by the counter to increase by the number of photons.

According to an embodiment, the electronic system further comprising a capacitor module electrically connected to the second electrical contact, wherein the capacitor module is configured to collect charge carriers from the second electrical contact.

According to an embodiment, the controller is configured to connect the second electrical contact to an electrical ground.

According to an embodiment, the controller is configured to deactivate the voltage comparator at a beginning of the time delay.

Disclosed herein is a system comprising: a first package comprising a first radiation detector, the first radiation detector being the radiation detector of any one of the radiation detectors disclosed above; wherein no sidewalls of the first radiation detector except the sidewall that is doped are configured to be exposed to radiation incident on the system.

According to an embodiment, the system further comprises a second package comprising a second radiation detector, wherein the second package is configured to prevent radiation from reaching a sidewall of the first radiation detector that is not doped.

According to an embodiment, the first package is mounted to a system PCB and the first radiation detector is tilted relative to the system PCB.

BRIEF DESCRIPTION OF FIGURES

FIG. 1 schematically shows a radiation detector, according to an embodiment.

FIG. 2A schematically shows a cross-sectional view of the radiation detector, according to an embodiment.

DETAILED DESCRIPTION

Figure 2B:
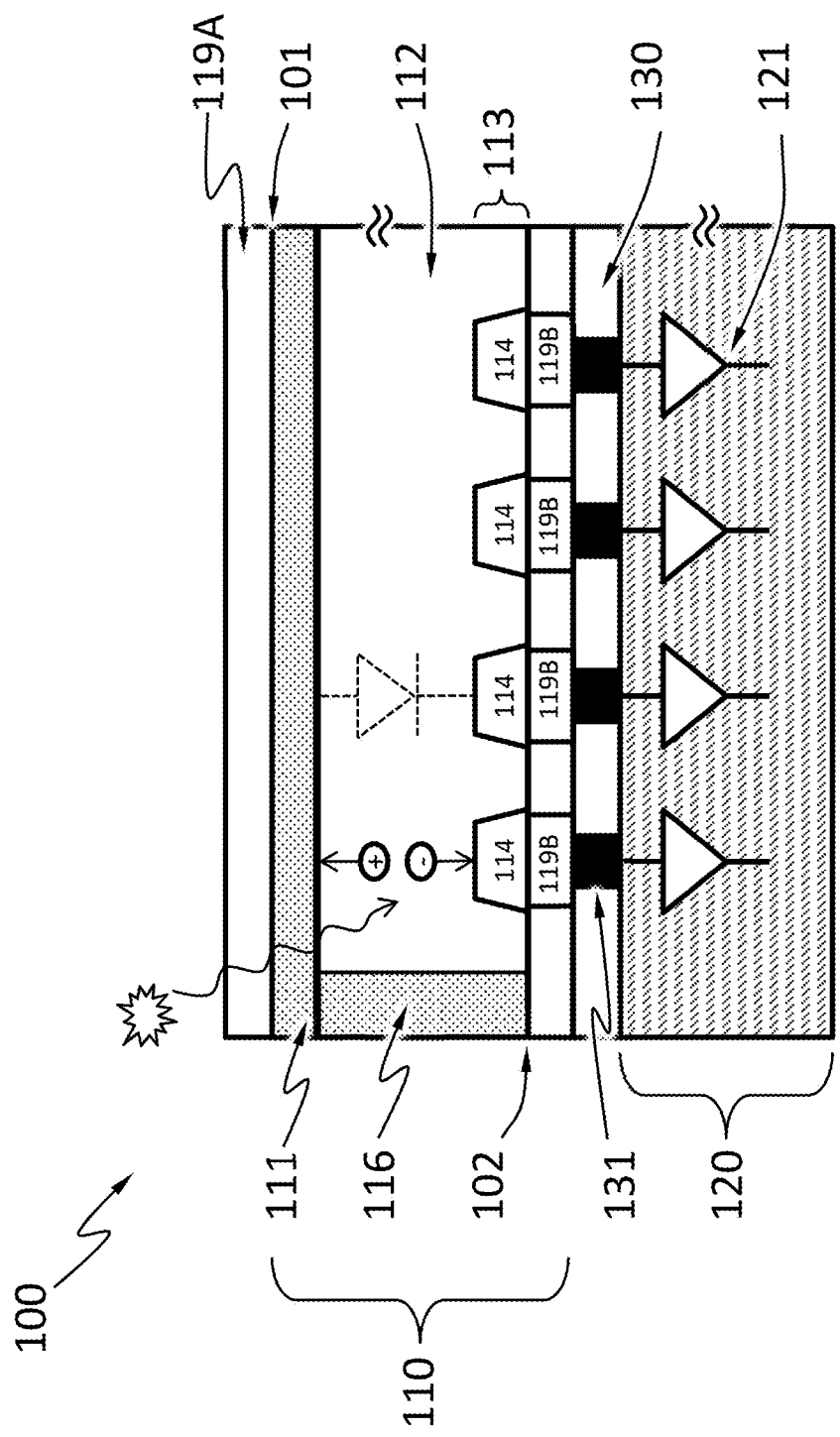
FIG. 2B schematically shows a detailed cross-sectional view of the radiation detector in FIG. 2A, according to an embodiment.

FIG. 1 schematically shows a radiation detector 100, as an example. The radiation detector 100 has an array of pixels 150. The array may be a rectangular array, a honeycomb array, a hexagonal array or any other suitable array. Each pixel 150 is configured to detect radiation from a radiation source incident thereon and may be configured measure a characteristic (e.g., the energy of the particles, the wavelength, and the frequency) of the radiation. For example, each pixel 150 is configured to count numbers of photons incident thereon whose energy falls in a plurality of bins, within a period of time. All the pixels 150 may be configured to count the numbers of photons incident thereon within a plurality of bins of energy within the same period of time. When the incident photons have similar energy, the pixels 150 may be simply configured to count numbers of photons incident thereon within a period of time, without measuring the energy of the individual photons. Each pixel 150 may have its own analog-to-digital converter (ADC) configured to digitize an analog signal representing the energy of an incident photon into a digital signal, or to digitize an analog signal representing the total energy of a plurality of incident photons into a digital signal. The pixels 150 may be configured to operate in parallel. For example, when one pixel 150 measures an incident photon, another pixel 150 may be waiting for a photon to arrive. The pixels 150 may not have to be individually addressable.

FIG. 2A schematically shows a cross-sectional view of the radiation detector 100, according to an embodiment. The radiation detector 100 may include a radiation absorption layer 110 configured to absorb an incident radiation and generate electrical signals from incident radiation, and an electronics layer 120 (e.g., an ASIC) for processing or analyzing the electrical signals generates in the radiation absorption layer 110. The radiation detector 100 may or may not include a scintillator. The radiation absorption layer 110 may include a semiconductor material such as, silicon, germanium, GaAs, CdTe, CdZnTe, or a combination thereof. The semiconductor may have a high mass attenuation coefficient for the radiation of interest.

FIG. 2B schematically shows a detailed cross-sectional view of the radiation detector 100, according to an embodiment. The radiation absorption layer 110 may comprise a first doped region 111 formed by doping a first surface 101, a second doped region 113 formed by doping a second surface 102, and a doped sidewall 116. The second surface 102 is opposite the first surface 101. The second doped region 113 may comprise one or more discrete regions 114. The radiation absorption layer 110 may further comprise a first electrical contact 119A on the first surface 101, a second electrical contact 119B on the second surface 102. The first electrical contact 119A may be in electrical contact with the first doped region 111 and the doped sidewall 116. The second electrical contact 119B may include discrete portions each of which is in electrical contact with the discrete regions 114. The doped sidewall 116 may be at all sides of the radiation absorption layer 110.

The doped sidewall 116 has a same type of doping as the first doped region 111 (e.g., both the first doped region 111 and the doped sidewall 116 are p type, or both the first doped region 111 and the doped sidewall 116 are n type). The doped sidewall 116 can be joined with the first doped region 111 and thus viewed as an extension thereof. The second doped region 113 may be separated from the first doped region 111 and the doped sidewall 116 by an optional the intrinsic region 112. The discrete regions 114 are separated from one another by the first doped region 111 or the intrinsic region 112. The first doped region 111 and the second doped region 113 have opposite types of doping (e.g., region 111 is p-type and region 113 is n-type, or region 111 is n-type and region 113 is p-type).

One or more diodes (e.g., p-i-n or p-n) may be formed by the first doped region 111 and the one or more discrete regions 114 of the second doped region 113. The first doped region 111 and the doped sidewall 116 may collectively be an electrode shared among the diodes, and each of the discrete regions 114 of the second doped region 113 may be another electrode of the diodes. The first doped region 111 may also have discrete portions.

When radiation from the radiation source hits the radiation absorption layer 110 including diodes, the radiation photon may be absorbed and generate one or more charge carriers by a number of mechanisms. The charge carriers may drift to the electrodes (e.g., the first doped region 111, the discrete regions 114) of one of the diodes under an electric field. The field may be an external electric field applied to the first and second electrical contacts 119A and 119B. In an embodiment, the charge carriers may drift in directions such that the charge carriers generated by a single particle of the radiation are not substantially shared by two different discrete regions 114 ("not substantially shared" here means less than 2%, less than 0.5%, less than 0.1%, or less than 0.01% of these charge carriers flow to a different one of the discrete regions 114 than the rest of the charge carriers). Charge carriers generated by a particle of the radiation incident around the footprint of one of these discrete regions 114 are not substantially shared with another of these discrete regions 114. A pixel 150 associated with a discrete region 114 may be an area around the discrete region 114 in which substantially all (more than 98%, more than 99.5%, more than 99.9%, or more than 99.99% of) charge carriers generated by a particle of the radiation incident therein flow to the discrete region 114. Namely, less than 2%, less than 1%, less than 0.1%, or less than 0.01% of these charge carriers flow beyond the pixel.

Figure 2C:
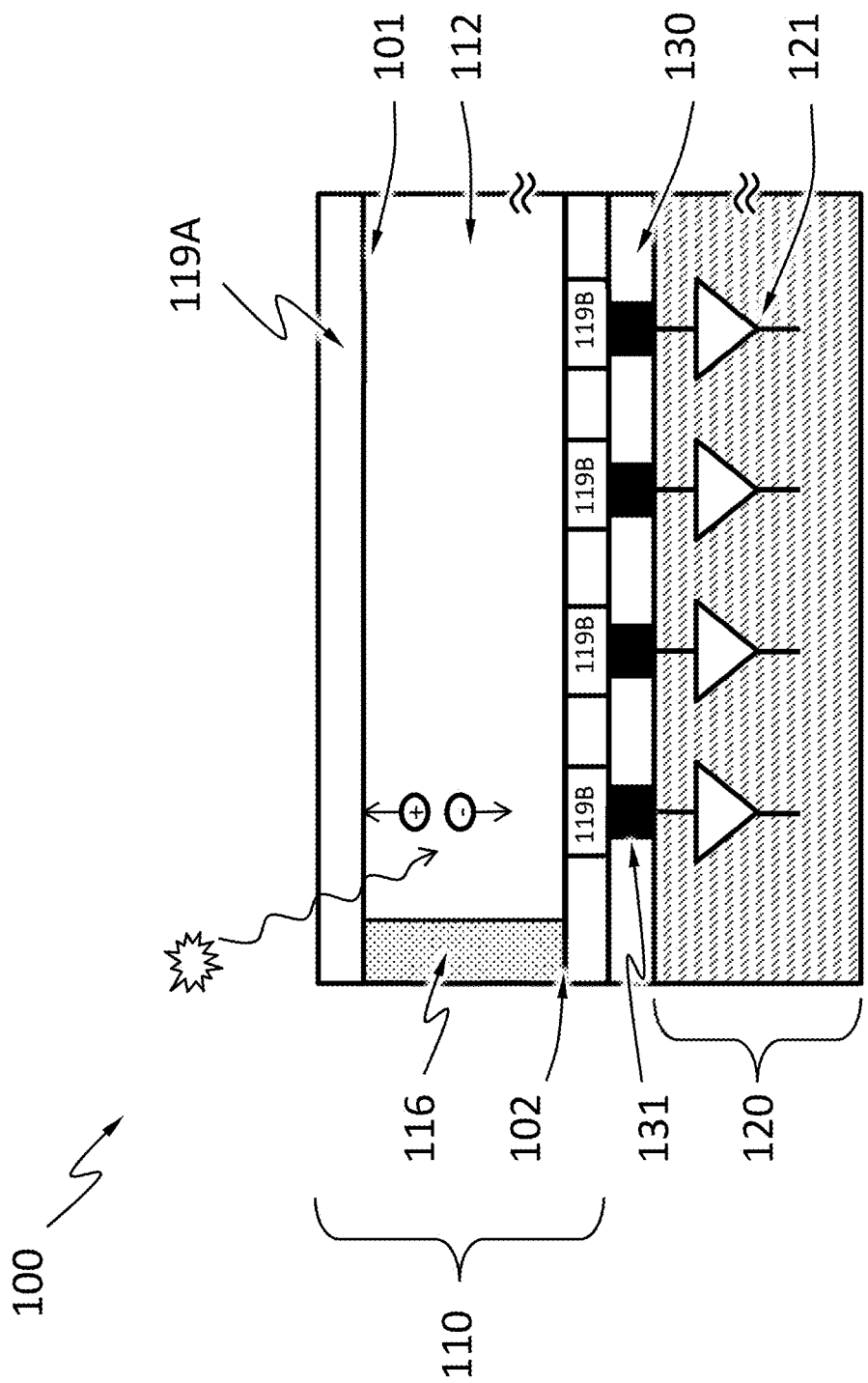
FIG. 2C schematically shows an alternative detailed cross-sectional view of the radiation detector in FIG. 2A, according to an embodiment.

As shown in an alternative detailed cross-sectional view of the radiation detector 100 in FIG. 2C, according to an embodiment, the radiation absorption layer 110 may include a resistor of a semiconductor material such as, silicon, germanium, GaAs, CdTe, CdZnTe, or a combination thereof, but does not include a diode. The semiconductor may have a high mass attenuation coefficient for the radiation of interest.

When the radiation hits the radiation absorption layer 110 including a resistor but not diodes, it may be absorbed and generate one or more charge carriers by a number of mechanisms. A particle of the radiation may generate 10 to 100000 charge carriers. The charge carriers may drift to the first and second electrical contacts 119A and 119B under an electric field. The field may be an external electric field. The second electrical contact 119B includes discrete portions. In an embodiment, the charge carriers may drift in directions such that the charge carriers generated by a single particle of the radiation are not substantially shared by two different discrete portions of the second electrical contact 119B ("not substantially shared" here means less than 2%, less than 0.5%, less than 0.1%, or less than 0.01% of these charge carriers flow to a different one of the discrete portions than the rest of the charge carriers). Charge carriers generated by a particle of the radiation incident around the footprint of one of these discrete portions of the second electrical contact 119B are not substantially shared with another of these discrete portions of the electrical contact 119B. A pixel 150 associated with a discrete portion of the second electrical contact 119B may be an area around the discrete portion in which substantially all (more than 98%, more than 99.5%, more than 99.9% or more than 99.99% of) charge carriers generated by a particle of the radiation incident therein flow to the discrete portion of the second electrical contact 119B. Namely, less than 2%, less than 0.5%, less than 0.1%, or less than 0.01% of these charge carriers flow beyond the pixel associated with the one discrete portion of the second electrical contact 119B. The doped sidewall 116 may help prevent current leakage at the sidewall.

Figure 2D:
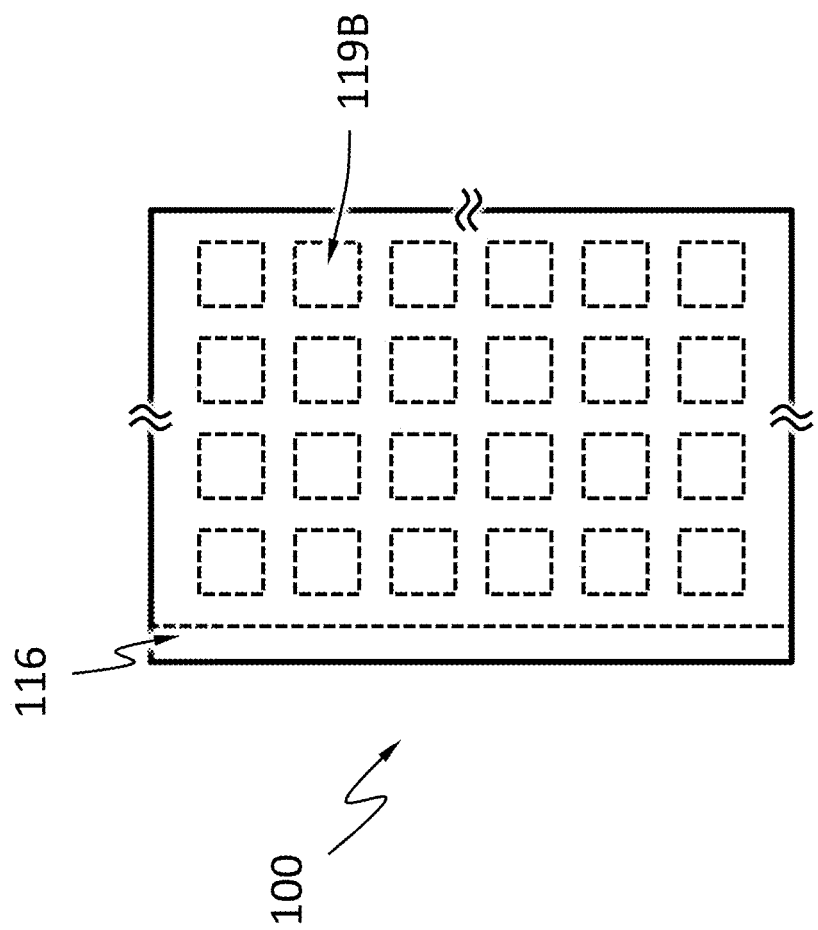
FIG. 2D schematically illustrates a top view of the radiation detector in FIG. 2A, according to an embodiment.

FIG. 2D schematically illustrates a top view of the radiation detector 100, according to an embodiment. The radiation detector 100 may have a rectangular shape, a hexagonal shape or any other suitable shapes. The radiation detector 100 may have one or more doped sidewalls. In example of FIG. 2D, the radiation detector 100 has a rectangular shape, and the doped sidewall 116 is the only doped sidewall of the radiation absorption layer 110. The doped sidewall 116 and the discrete regions (e.g., 114 or 119B) in FIG. 2D are shown in dashed line since they cannot be seen directly from the top view.

The electronics layer 120 may include an electronic system 121 configured to process electrical signals on the second electrical contact 119B generated by the radiation incident on the radiation absorption layer 110. The electronic system 121 may include an analog circuitry such as a filter network, amplifiers, integrators, and comparators, or a digital circuitry such as a microprocessors, and memory. The electronic system 121 may include one or more ADCs. The electronic system 121 may include components shared by the pixels or components dedicated to a single pixel. For example, the electronic system 121 may include an amplifier dedicated to each pixel and a microprocessor shared among all the pixels. The electronic system 121 may be electrically connected to the pixels by vias 131. Space among the vias may be filled with a filler material 130, which may increase the mechanical stability of the connection of the electronics layer 120 to the radiation absorption layer 110. Other bonding techniques are possible to connect the electronic system 121 to the pixels without using vias.

Figure 3:
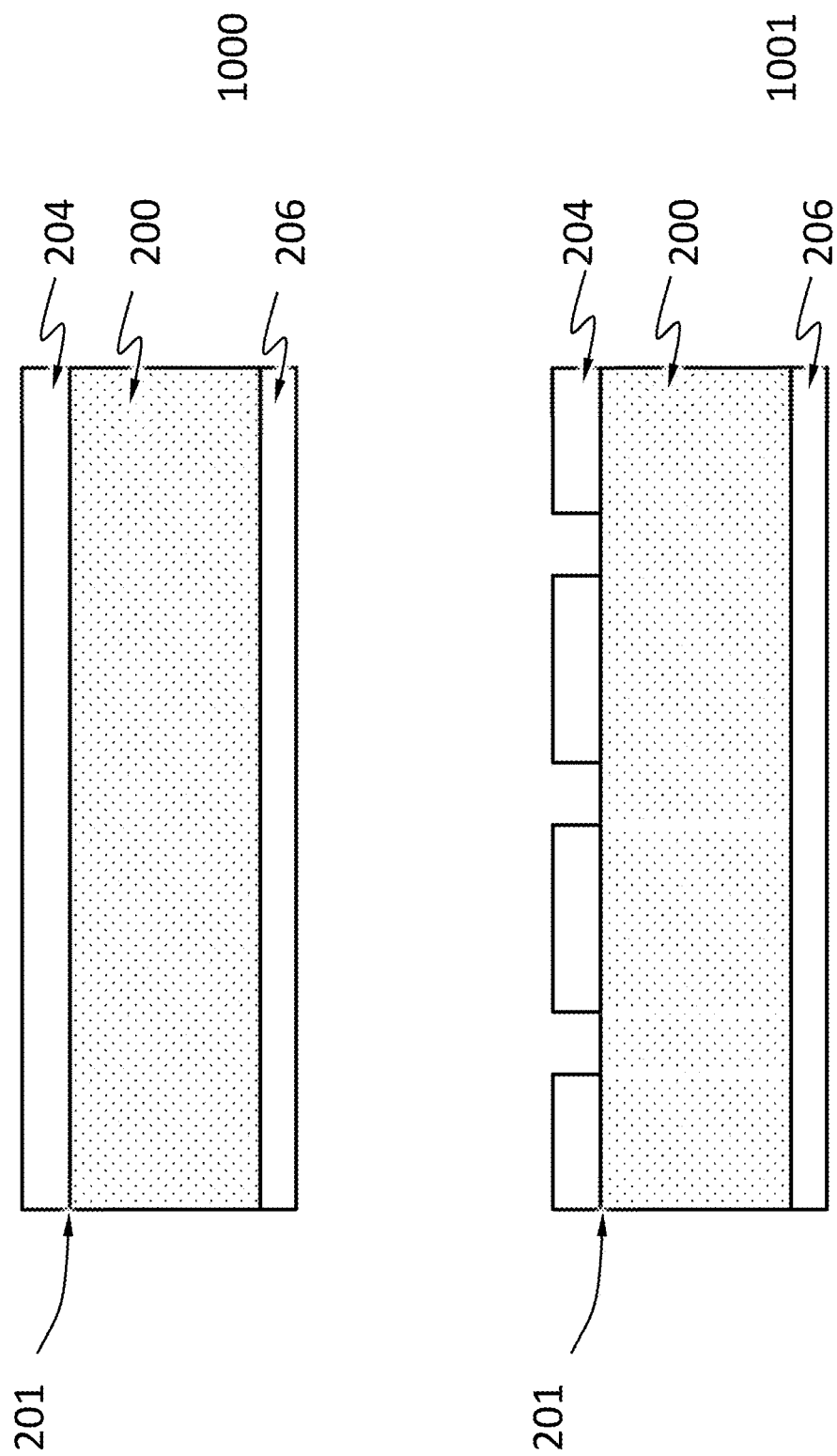
FIG. 3 schematically illustrates a process of forming the radiation absorption layer in FIG. 2B, which includes diodes, according to an embodiment.
Figure 3:
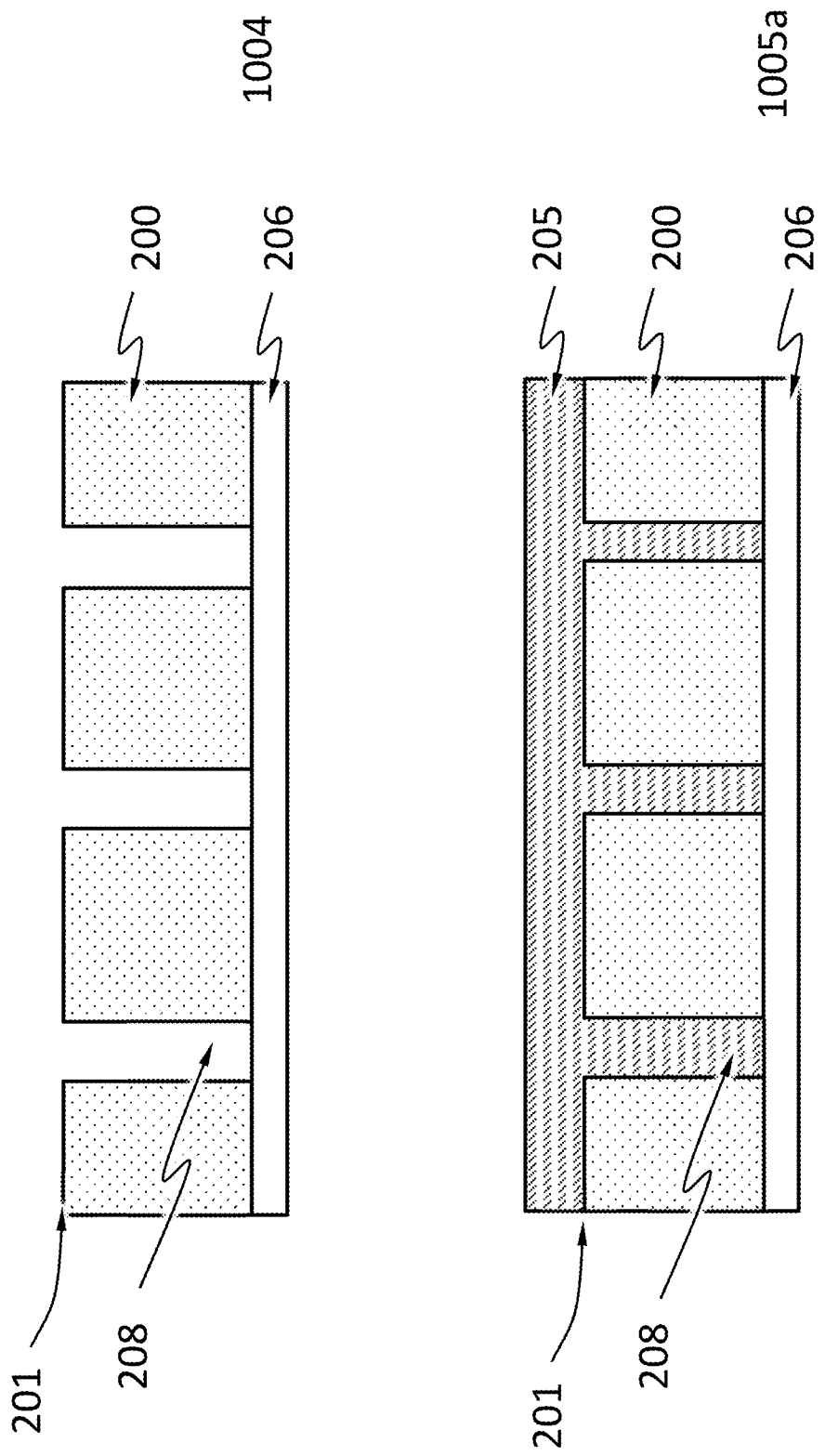
Figure 3:
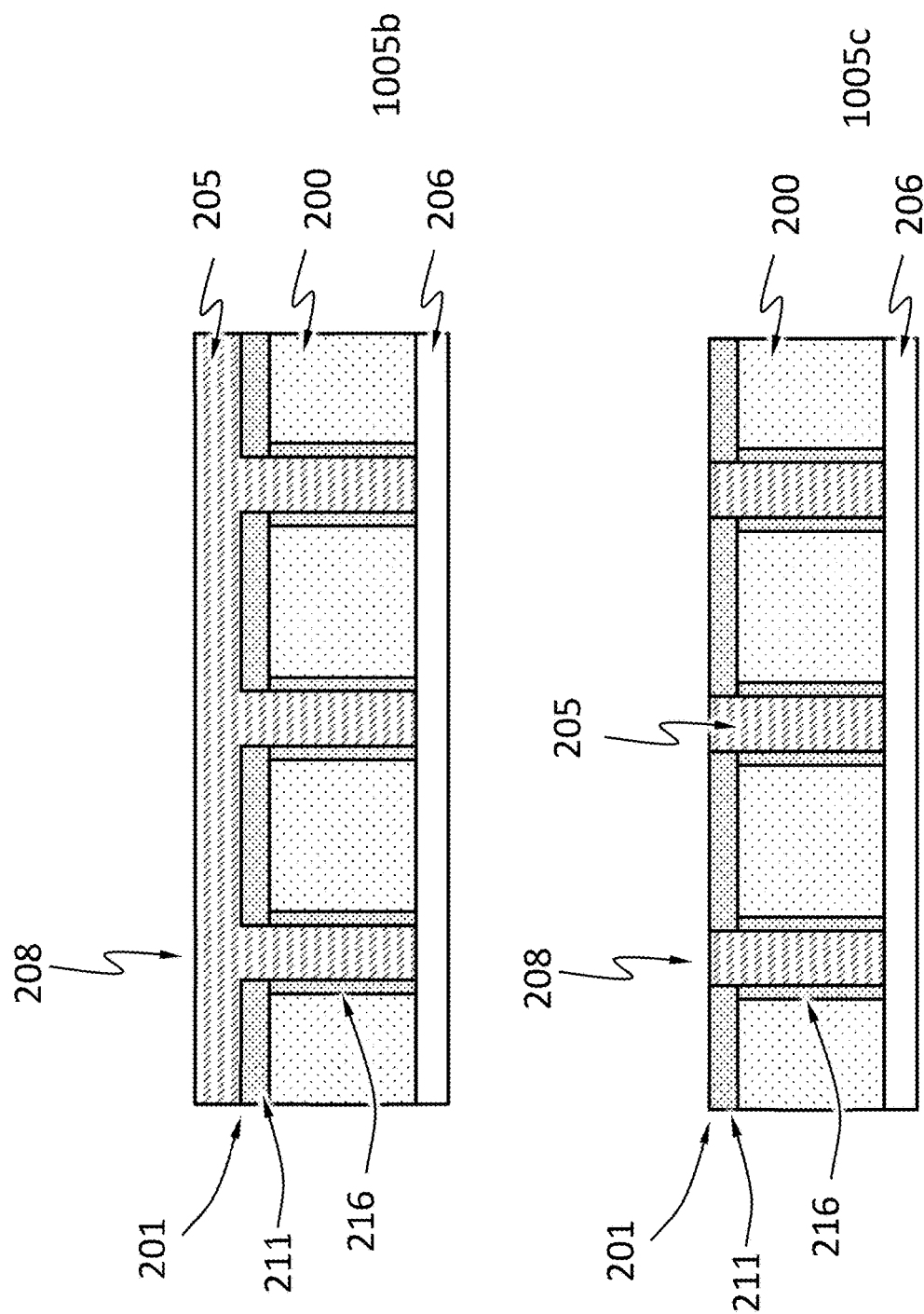
Figure 3:
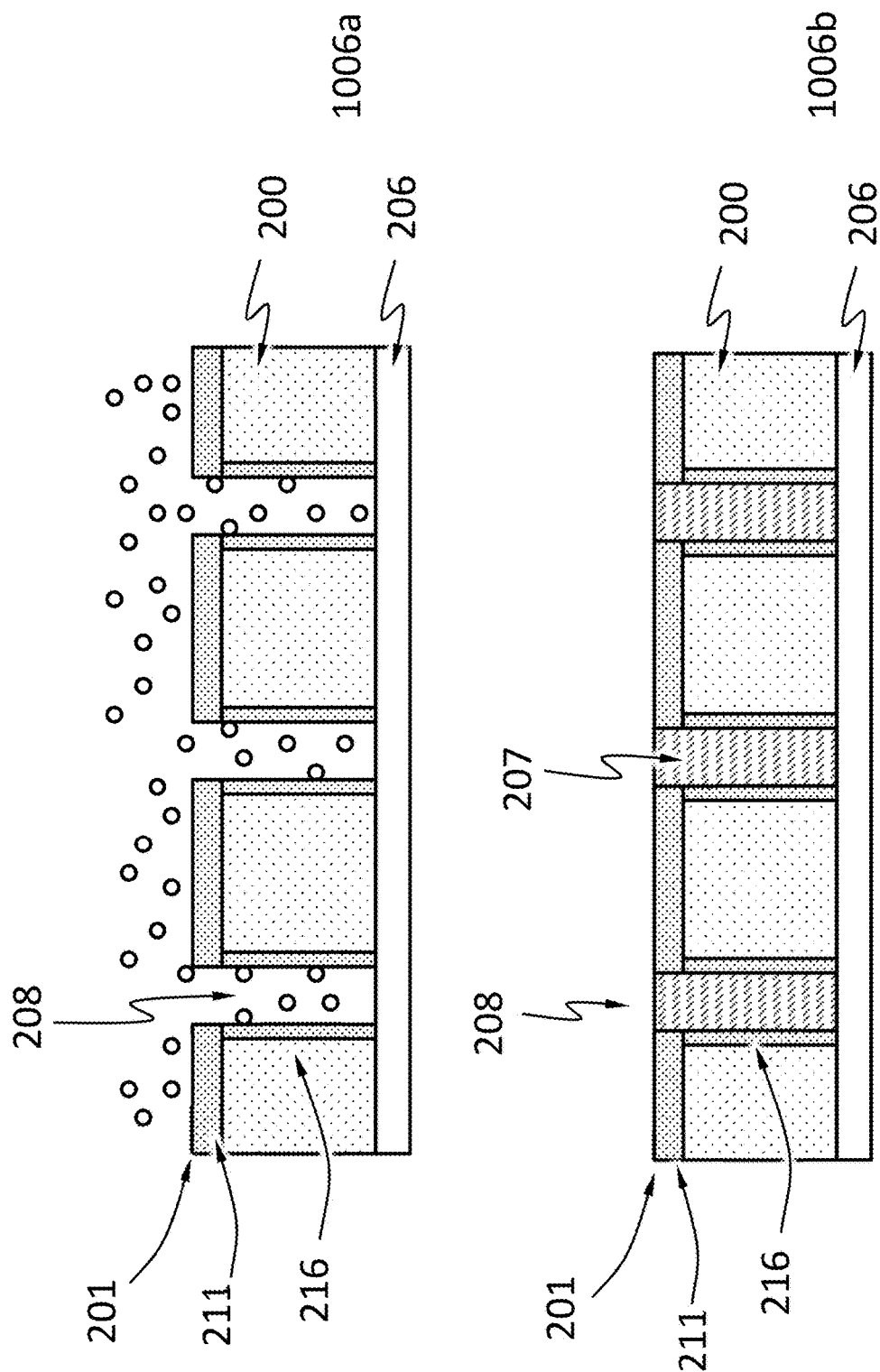
Figure 3:
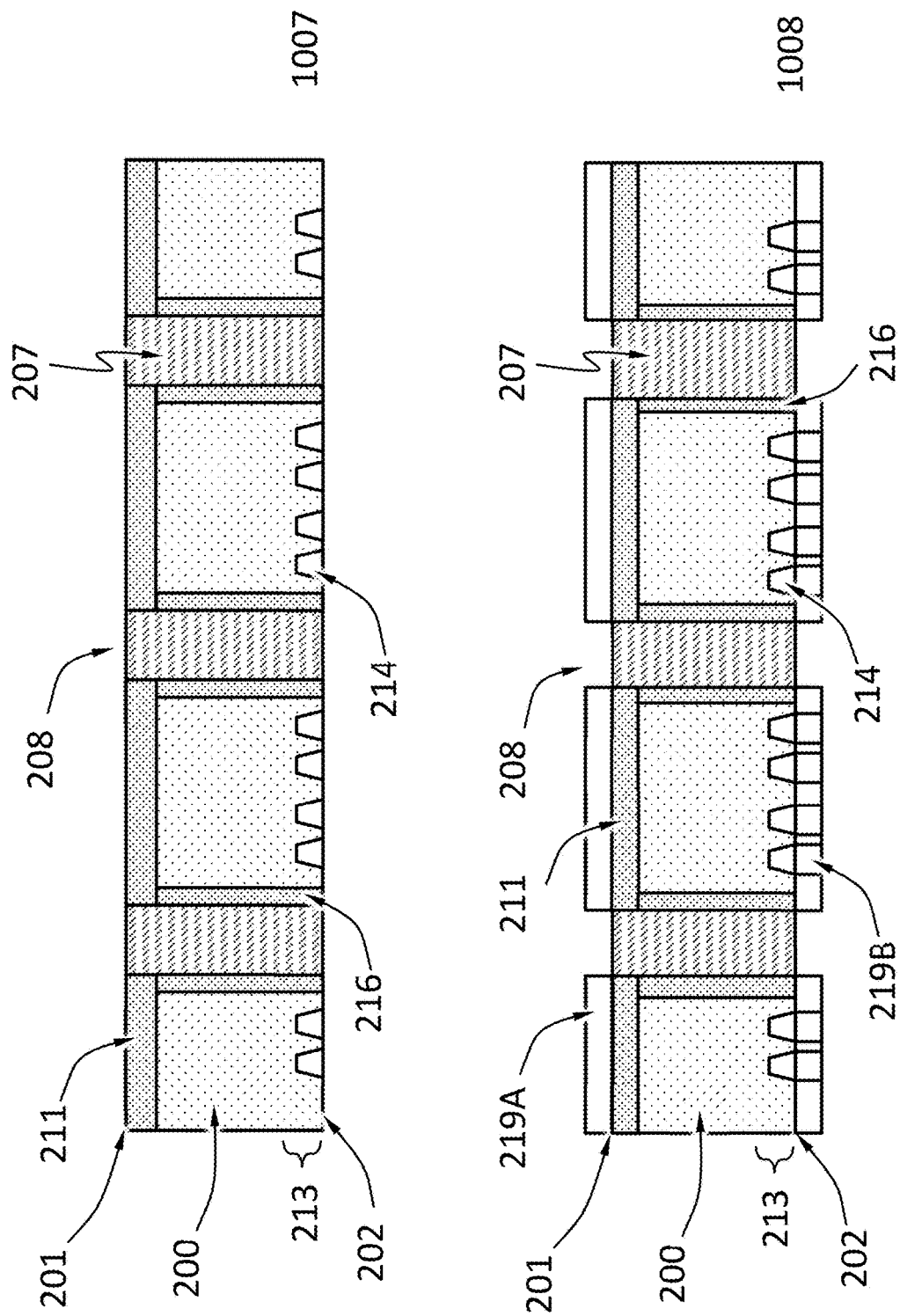
Figure 3:
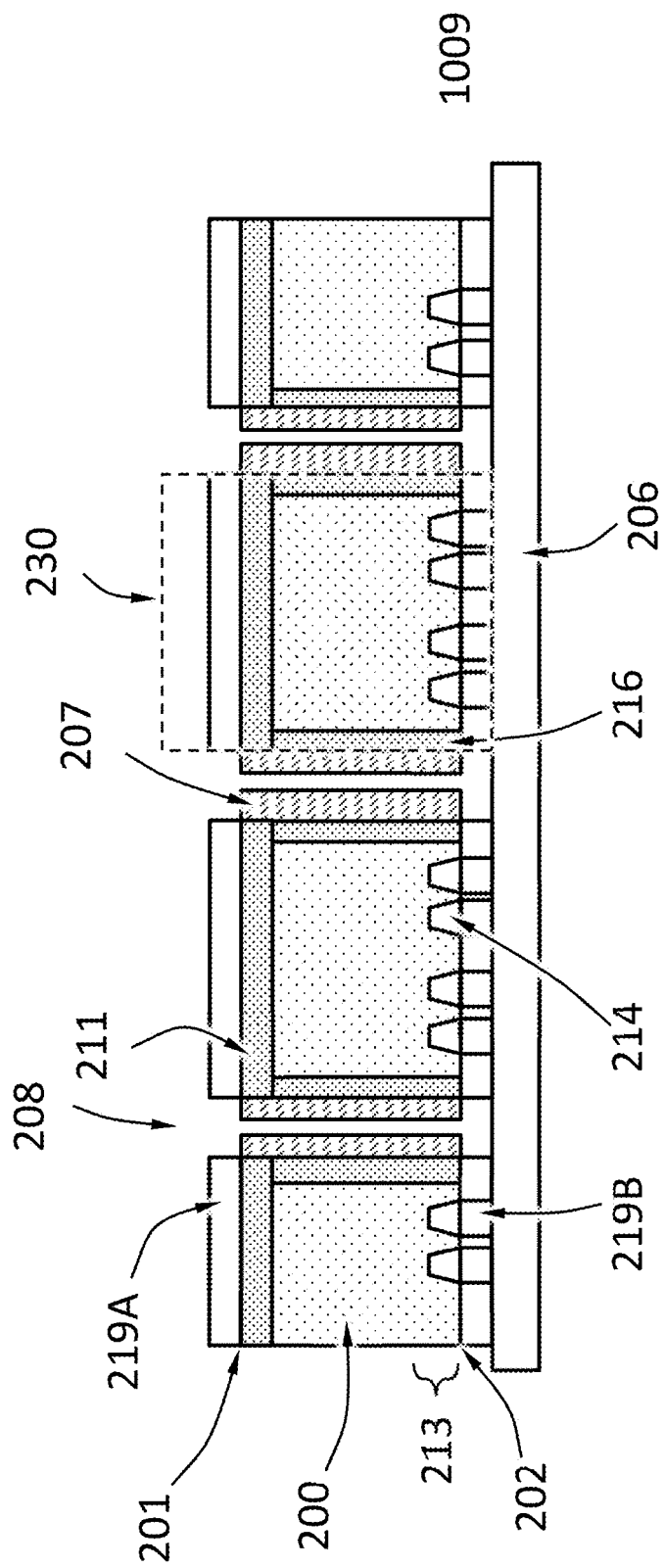
Figure 3:
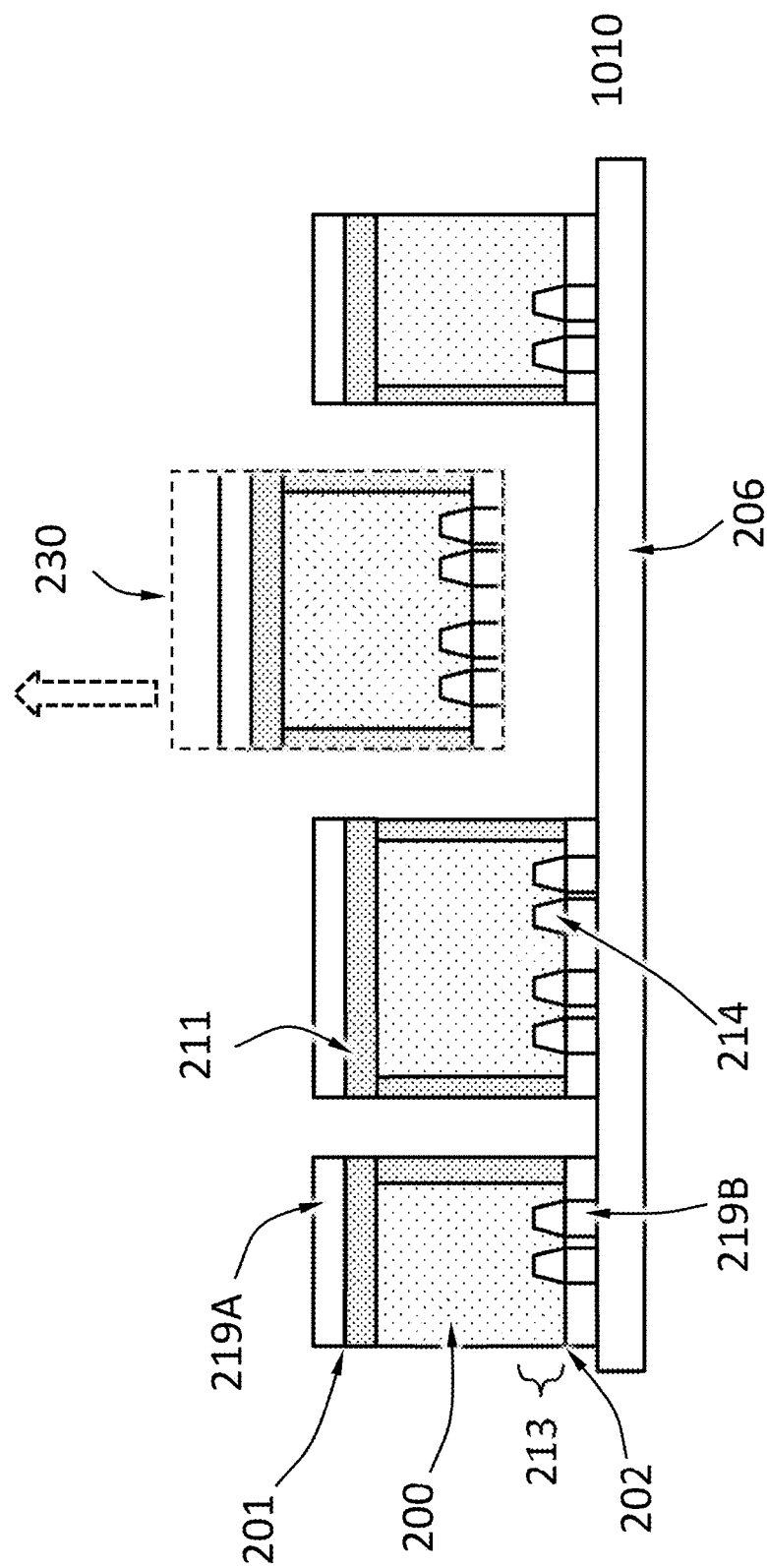

FIG. 3 schematically illustrates a process of forming the radiation absorption layer 110 in FIG. 2B, which includes diodes, according to an embodiment.

In step 1000, a mask layer 204 is formed onto a first surface 201 of a substrate 200. The substrate 200 may be attached to a support 206. The substrate 200 may include a semiconductor material such as, silicon, germanium, GaAs, CdTe, CdZnTe, or a combination thereof. The mask layer 204 may serve as an etch mask for forming trenches 208 as shown in step 1002. The mask layer 204 may comprise a material such as silicon dioxide, silicon nitride, amorphous carbon or metals (e.g., aluminum, chromium). The thickness of the mask layer 204 may be determined according to the depth of the trenches 208 and etching selectivity (i.e., ratio of etching rates of the mask layer 204 and the substrate 200). In an embodiment, the mask layer 204 may have a thickness of a few microns. The mask layer 204 may be formed onto the first surface 201 by various techniques, such as physical vapor deposition, chemical vapor deposition, spin coating, sputtering or any other suitable processes. In an embodiment, the substrate 200 is a silicon substrate, and the mask layer 204 is a silicon dioxide layer formed by thermal oxidation of the surface of the substrate 200, where the substrate 200 is exposed to oxygen ("dry oxidation") or a mixture of high-purity oxygen and hydrogen ("wet oxidation") at an elevated temperature (e.g., 800-1200° C.) in a furnace, thereby causing the silicon on the surface of the substrate 200 to react with oxygen in the environment to form the silicon dioxide layer.

In step 1001, the mask layer 204 is patterned to have openings in which the substrate 200 is exposed. Shapes and locations of the openings correspond to the shapes and locations of the trenches 208 to form in step 1002. The pattern formation on the mask layer 204 may involve lithography process or any other suitable processes. For example, a resist layer may be first deposited (e.g., by spin coating) onto the surface of the mask layer 204, and lithography is followed to form the openings. The resolution of the lithography is limited by the wavelength of the radiation used. Photolithography tools using deep ultraviolet (DUV) light with wavelengths of approximately 248 and 193 nm, allows minimum feature sizes down to about 50 nm. E-beam lithography tools using electron energy of 1 keV to 50 keV allows minimum feature sizes down to a few nanometers.

In step 1002, the trenches 208 are formed into the first surface 201 of the substrate 200 by etching portions of the substrate 200 uncovered by the mask layer 204 to a desired depth (e.g., the trenches 208 may extend through an entire thickness of the substrate 200). The trenches 208 may be vertical to the first surface 201. The etching process may be carried out a technique such as dry etching, wet etching, or a combination thereof. Dry etching is a type of etching processes such as ion beam etching, plasma etching, reactive-ion etching, deep reactive-ion etching (DRIE), etc. Areas not protected by a mask (e.g., photoresist mask or other types of masks) may be removed physically or chemically with a dry etching process. Wet etching is a type of etching processes using liquid-phase etchants. A substrate may be immersed in a bath of etchant, and areas not protected by the masks may be removed.

In an embodiment, forming the trenches 208 may comprise deep reactive-ion etching (DRIE). DRIE is capable of producing deep penetration, steep-sided holes and highly vertical trenches in substrates. The depth of the trenches 208 may be controlled approximately by adjusting etching time and etch rate of the DRIE. The sidewalls of the trenches 208 excavated with DRIE may have rough surfaces. For example, during a Bosch process (which is one type of DRIE), substrate materials are incrementally excavated with two repeatedly alternating processes (an isotropic plasma etching and a deposition of a chemically inert passivation layer), causing the side walls the trenches 208 to undulate with an amplitude of hundreds of nanometer.

In step 1003, a wet etching may be carried out after the trenches 208 are formed to smooth out the roughness of the sidewalls of the trenches 208.

In step 1004, the mask layer 204 may be removed by wet etching, chemical mechanical polishing or some other suitable techniques. In an embodiment where the mask layer 204 is a silicon dioxide layer, the mask layer 204 can be removed by hydrofluoric acid (HF) or buffered HF. Hydrofluoric acid essentially does not etch silicon.

The sidewalls of the trenches 208 and the first surface 201 may be doped by various methods, such as a first doping method illustrated in steps 1005a-1005c, or a second doping method illustrated in steps 1006a-1006b. Each of the doped sidewalls 216 (as shown in 1005b, 1005c, 1006a and 1006b) of the trenches 208 may function as the doped sidewall 116 of the radiation absorption layer 110. Doping the first surface 201 forms a first doped region 211 (as shown in 1005b, 1005c, 1006a and 1006b). A portion of the first doped region 211 may function as the first doped region 111 of the radiation absorption layer 110.

In the first doping method illustrated in steps 1005a-1005c, doping the sidewalls of the trenches 208 and the first surface 201 comprises depositing doped polysilicon 205 or other suitable materials into the trenches 208 and onto the first surface 201, as shown in step 1005a. In an embodiment, forming the doped polysilicon 205 may involve an in-situ doping technique, in which the polysilicon doping is carried out during the polysilicon deposition process. A chemical vaporization deposition (CVD) process may be used to deposited polysilicon at elevated temperature (e.g., around 600° C.), and the p type or n type dopant gases (e.g., phosphine, arsine, or diborane) are added to the reactant gases (e.g., silane) used for polysilicon deposition with CVD. In another embodiment, the polysilicon deposition may be carried out first, and then the polysilicon is doped. The p type or n type dopants may be deposited into the polysilicon by methods such as diffusion doping and ion implantation. For instance, p type or n type dopants may be deposited into the polysilicon region by directly bombarding the region with high-energy ions of the dopant species.

In step 1005b, the substrate 200 is annealed. The dopants in the doped polysilicon 205 diffuse into the first surface 201 and the sidewalls of the trenches 208 at elevated temperatures (e.g., around 900° C.), so that the first doped region 211 and the doped sidewalls 216 form. The high-temperature environment of the annealing not only promotes dopant diffusion from doped polysilicon 205, but also anneals out defects of the first doped region 211, the doped sidewalls 216 and the substrate 200.

In step 1005c, the doped polysilicon 205 on top of the first surface 201 may be removed by a method such as wet etching, chemical mechanical polishing or any other suitable techniques. Meanwhile, the doped polysilicon 205 in the trenches 208 are retained to provide a level surface for following steps such as depositing electrical contacts.

In the second doping method illustrated in step 1006a and step 1006b, which is an alternative to the first doping method illustrated in steps 1005a-1005c, doping the sidewalls of the trenches 208 and the first surface 201 comprises diffusing gaseous dopants into the sidewalls of the trenches 208 and the first surface 201, as shown in step 1006a. A carrier gas (e.g., nitrogen, argon) enriched with the desired dopant may be led to the first surface 201 and the sidewalls of the trenches 208. The dopants gradually diffuse into the substrate 200 so that the first doped region 211 and the doped sidewalls 216 form. The substrate 200 may be annealed during or after diffusion to drive the dopants deeper into the substrate 200.

In step 1006b, the trenches 208 may be filled with a filler material 207 to provide a level surface for following steps such as depositing electrical contacts. The filler material 207 may be polysilicon or any other suitable materials.

In an embodiment, doping the sidewalls of the trenches 208 and the first surface 201 are not necessarily done at the same time or in a same process as shown in step 1005*a*-step 1005*c* or step 1006*a*-step 1006*b*. For example, the sidewalls of the trenches 208 can be doped right after step 1003 before removing the mask layer 204 and doping the first surface 201.

In step 1007, a second doped region 213 is formed by doping a second surface 202 of the substrate 200. The second surface 202 is opposite the first surface 201. The substrate 200 may be lifted off from the support 206 prior to the doping. The second doped region 213 and the first doped region 211 are doped with opposite types of dopants (e.g., region 211 is p-type and region 213 is n-type, or region 211 is n-type and region 213 is p-type). In an embodiment, the second doped region 213 may comprise one or more discrete regions 214 that are doped. A portion of the second doped region 213 may function as the second doped region 113 of the radiation absorption layer 110, and some of the discrete regions 214 may function as the discrete regions 114. Doping the discrete regions 214 may involve a process similar to the step 1001, in which a mask with openings is formed. Shapes and locations of the openings correspond to the shapes and locations of the discrete regions 214. The discrete regions 214 uncovered by the mask are doped by a method such as diffusion or ion implantation, and processes such as annealing and mask removal may follow after doping.

In step 1008, the first and second electrical contacts 219A and 219B are deposited onto the first surface 201 and the second surface 202 respectively. The first and second electrical contacts 219A and 219B each of which may comprise a conducting material such as a metal (e.g., gold, copper, aluminum, platinum, etc.), or any other suitable conducting materials. A portion of the first electrical contact 219A may function as the first electrical contact 119A of the radiation absorption layer 110. A portion of the second electrical contact 219B may function as the second electrical contact 119B of the radiation absorption layer 110 in FIG. 2B. The second electrical contact 219B may comprise discrete regions each of which is in electrical contact with the discrete regions 214.

Forming the first and second electrical contacts 219A and 219B may involve forming masks with openings on the first and second surface 202 respectively by processes similar to the step 1001 shown in FIG. 3. Conducing materials such as metal may be deposited into the openings the by a suitable technique such as physical vapor deposition, chemical vapor deposition, spin coating, sputtering, etc., so that the first and second electrical contacts 219A and 219B form. The first and second electrical contacts 219A and 219B may not cover the top and bottom surfaces of the filler material 207 in the trenches 208, which are covered by the masks before the masks are removed.

In step 1009 and step 1010, one or more dies 230 are cut out by substrate dicing, which is followed by some post-dicing treatments. Each of the one or more dies 230 is an embodiment of the radiation absorption layer 110. The first doped region 211, the discrete regions 214 of the second doped region 213, the doped sidewall 216 and the first and second electrical contacts 219A and 219B of the die 230 correspond to the first doped region 111, the discrete regions 114 of the second doped region 113, the doped sidewall 116 and the first and second electrical contacts 119A and 119B of the radiation absorption layer 110 respectively. In an embodiment, an interior region of the substrate 200 of the die 230 may remain intrinsic and correspond to the intrinsic region 112 of the radiation absorption layer 110.

In step 1009, substrate dicing is performed by dicing along a plurality of dicing streets 220 to separate the one or more dies 230 from each other and from the rest of the substrate 200. The dicing streets 220 may cut through and section the trenches 208. The whole substrate may be attached to a support 206 during the substrate dicing. The substrate dicing may involve processes such as dicing etching, mechanical sawing or laser cutting.

In step 1010, some post-dicing treatments may be performed, including removing the filler material 207, lifting off the dies 230 from the support 206, etc. Removing the filler material 207 may comprise an isotropic etching such as wet etching.

Forming the radiation absorption layer 110 may comprise some intermediate steps such as surface cleaning, polishing, surface passivation, which are not shown in FIG. 3. The order of the steps shown in FIG. 3 may be changed to suit different formation needs. For example, the second doped region 213 may be doped before the first doped region 211.

Figure 4:
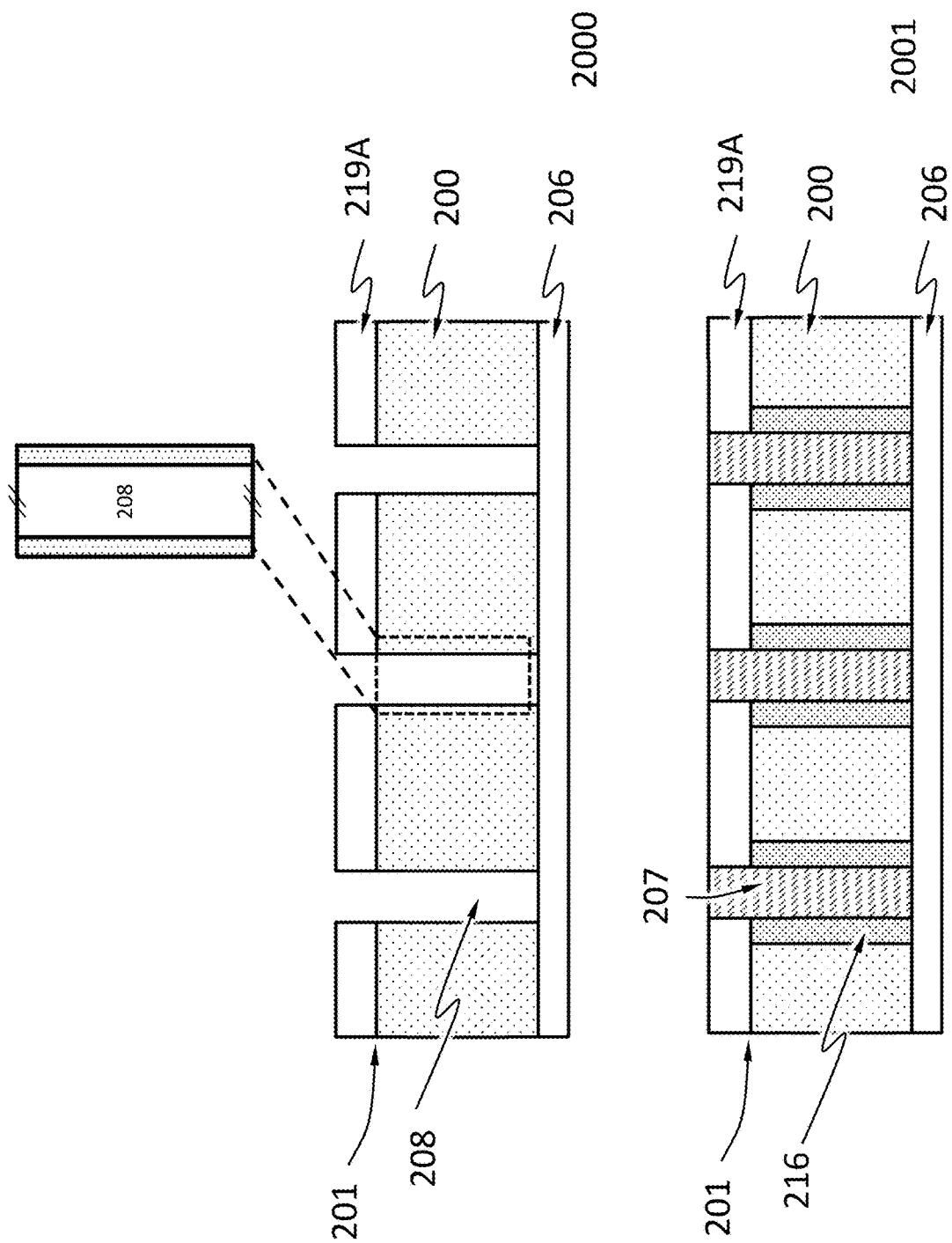
FIG. 4 schematically illustrates a process of forming the radiation absorption layer in FIG. 2C, which includes resistors not diodes, according to an embodiment.
Figure 4:
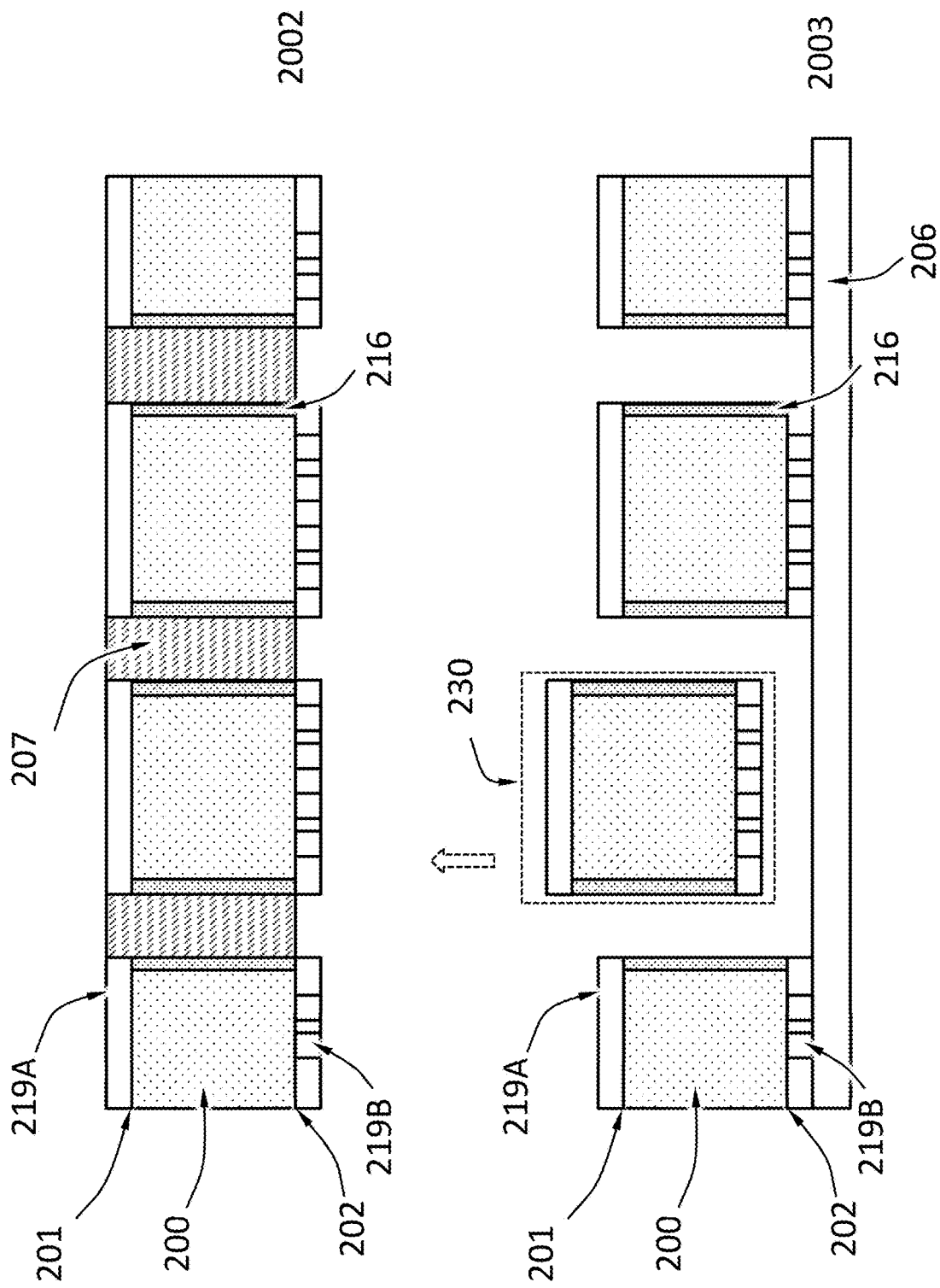

FIG. 4 schematically illustrates a process of forming the radiation absorption layer 110 as shown in FIG. 2C, which includes resistors not diodes, according to an embodiment.

In step 2000, a semiconductor substrate shown in step 1003 of FIG. 3 is acquired, by carrying out steps 1000-1003 of FIG. 3. In an embodiment, the mask layer (i.e., 204 in steps 1000-1003) formed onto the first surface 201 comprises a conducting material such as metals (e.g. aluminum, copper, gold, platinum, etc.), so that the mask layer also may function as the first electrical contact 219A.

In step 2001, the sidewalls of the trenches 208 are doped and become doped sidewalls 216, by either the first method illustrated in steps 1005*a*-1005*c* or the second method illustrated in step 1006*a* and step 1006*b*. Since the first surface in step 2001 is covered by the first electrical contact 219A, the first surface 201 is not doped during the doping of the sidewalls. The trenches 208 are filled with a filler material 207 to provide level surface for following steps such as depositing electrical contacts. The filler material 207 may be polysilicon (e.g., 205 in step 1005*c*) or any other suitable materials.

In step 2002, the second electrical contact 219B is deposited onto the second surface 202 by a process described in step 1008 of FIG. 3.

In step 2003, processes such as substrate dicing, filler material 207 removal and die lifting are carried out by following the steps 1009-1010 described in FIG. 3. Each of the one or more dies 230 in FIG. 4 is an embodiment of the radiation absorption layer 110 in FIG. 2C, which includes resistors not diodes. The doped sidewall 216 and the first and second electrical contacts 219A and 219B of the die 230 correspond to the doped sidewall 116 and the first and second electrical contacts 119A and 119B of the radiation absorption layer 110 in FIG. 2C respectively.

Figure 5:
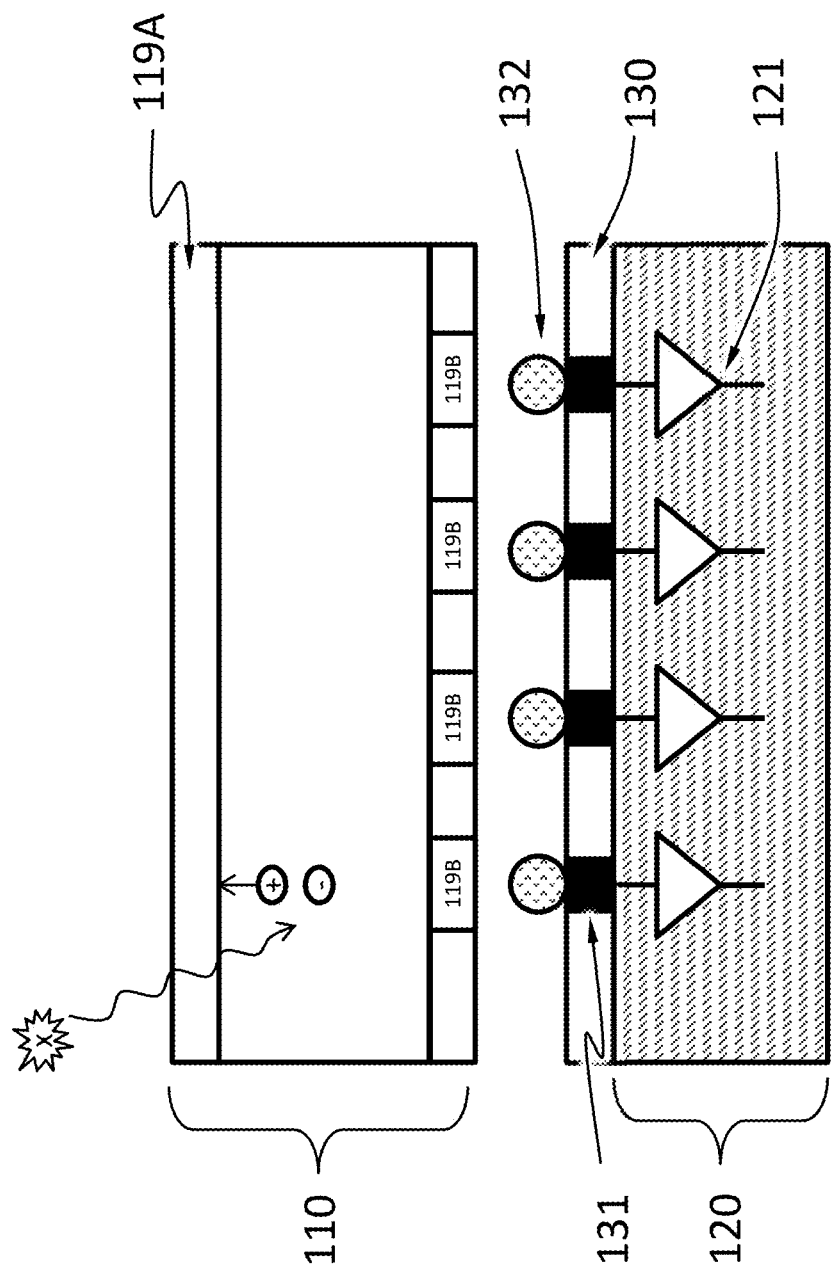
FIG. 5 schematically illustrates bonding between the radiation absorption layer and the electronics layer to form the radiation detector in FIG. 2A, according an embodiment.

FIG. 5 schematically illustrates bonding between the radiation absorption layer 110 and the electronics layer 120 to form the radiation detector 100, according an embodiment. Each of the discrete regions of the second electrical contact 119B may bond to each of the vias 131 by a suitable technique such as direct bonding or flip chip bonding.

Direct bonding is a wafer bonding process without any additional intermediate layers (e.g., solder bumps). The bonding process is based on chemical bonds between two surfaces. Direct bonding may be at elevated temperature but not necessarily so.

Flip chip bonding uses solder bumps 132 deposited onto contact pads (e.g., discrete regions of the second electrical contact 119B of the radiation absorption layer 110 or contacting surfaces of the vias 131). Either the radiation absorption layer 110 or the electronic layer 120 is flipped over and discrete regions of the second electrical contact 119B are aligned to the vias 131. The solder bumps 132 may be melted to solder the second electrical contact 119B and the vias 131 together. Any void space among the solder bumps 199 may be filled with an insulating material.

Figure 6A:
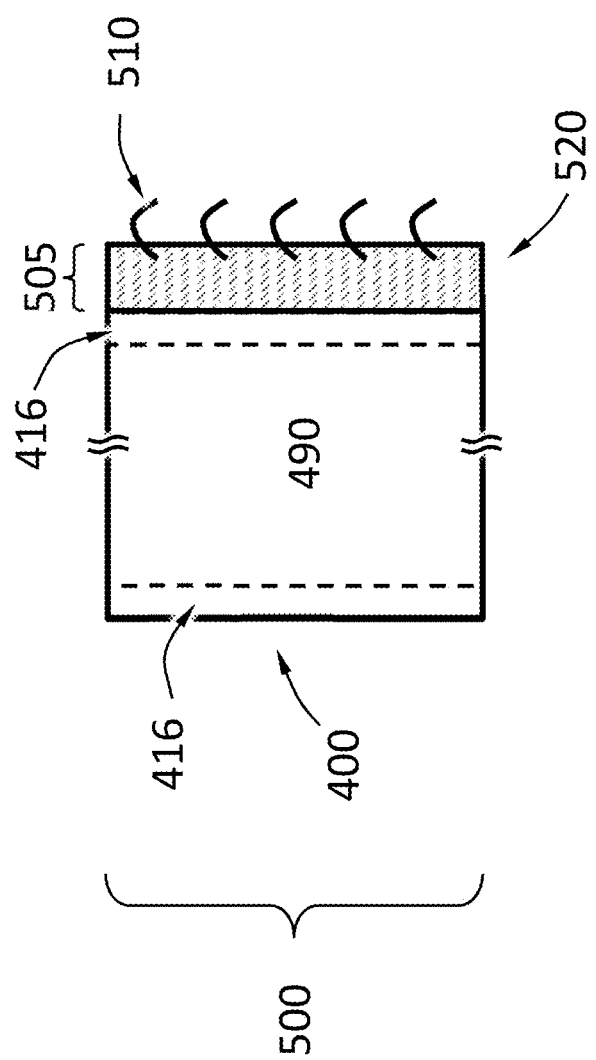
FIG. 6A schematically shows a top view of a package including a radiation detector and a printed circuit board (PCB), according to an embodiment.

FIG. 6A schematically shows a top view of a package 500 including a radiation detector 400 and a printed circuit board (PCB) 520, according to an embodiment. The radiation detector 400 is an embodiment of the radiation detector 100. The term "PCB" as used herein is not limited to a particular material. For example, a PCB may include a semiconductor. The radiation detector 400 is mounted to the PCB 520. The wiring between the radiation detector 400 and the PCB 520 is not shown for the sake of clarity. The electrical connection between the PCBs 520 in the packages 500 and a system PCB (e.g., system PCB 550 in FIGS. 6B and 6C) are made by bonding wires 510. The radiation detector 400 may have an active area 490, which is where the radiation detection occurs. The radiation detector 400 may comprise a doped sidewall 416, and no sidewalls of the radiation detector 400 except the doped sidewall 416 are configured to be exposed to radiation incident on the package 500. The PCB 520 may comprise an area 505 that is not covered by the radiation detector 400, for accommodating bonding wires 510. The area 505 may be considered to be part of a dead zone of the package 500, in which incident photons cannot be detected.

Figure 6B:
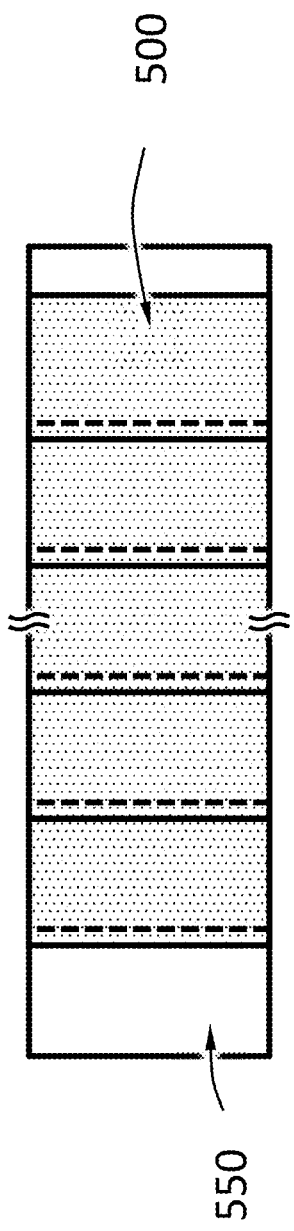
FIG. 6B and FIG. 6C schematically show a top view and a cross-sectional view of a system comprising a plurality of the packages, according to an embodiment.
Figure 6C:
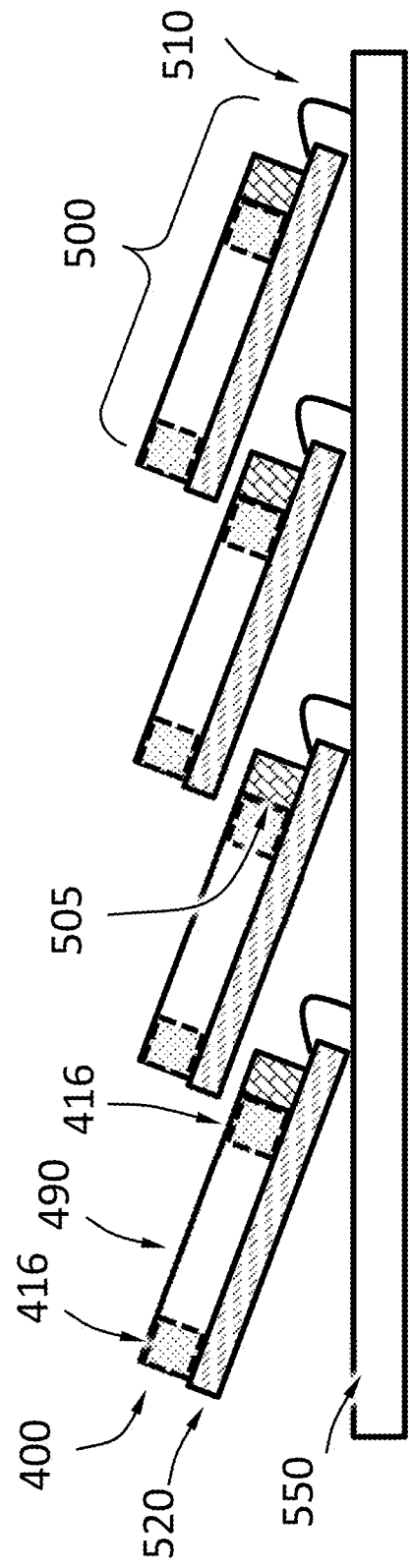

FIG. 6B and FIG. 6C schematically show a top view and a cross-sectional view of a system comprising a plurality of the packages 500, according to an embodiment. The system may be an image sensor. The packages 500 may be mounted to a system PCB 550 and are arranged in a row. The packages 500 may be tilted relative to the system 550 as shown in FIG. 6C. The packages 500 in a row partially overlap with one another (analogous to a column of roofing shingles) as shown in FIG. 6B and FIG. 6C, such that, within a row, one un-doped sidewall of the radiation detector 400 and the area 505 of a package 500 are shadowed by its neighboring package to prevent radiation from reaching the un-doped sidewall and the area 505 of the package 500. The other un-doped sidewalls of the radiation detector 400 may also be covered so that radiation will not reach the other un-doped sidewalls of the radiation detector 400.

Figure 7A:
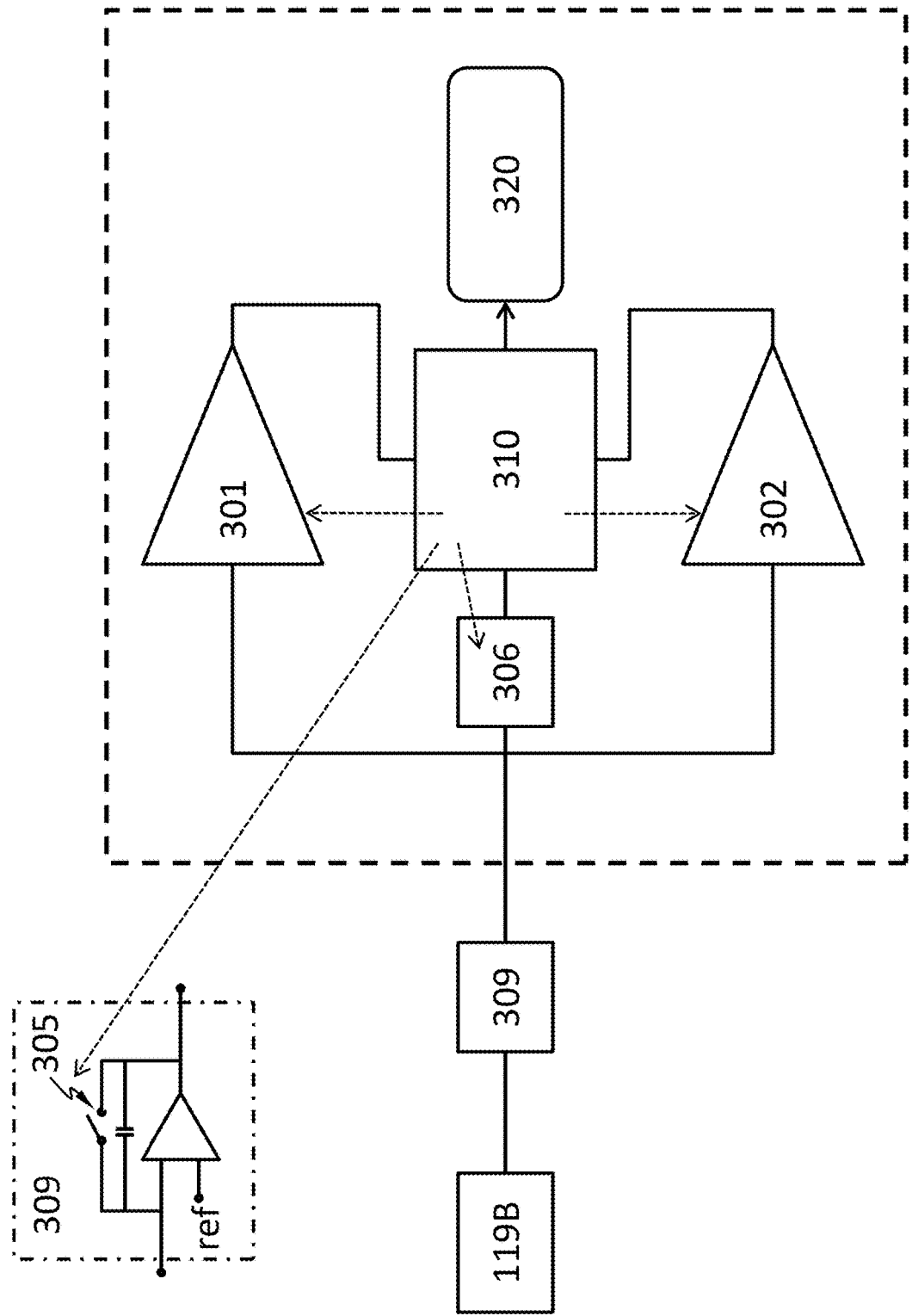
FIG. 7A and FIG. 7B each show a component diagram of the electronic system, according to an embodiment.
Figure 7B:
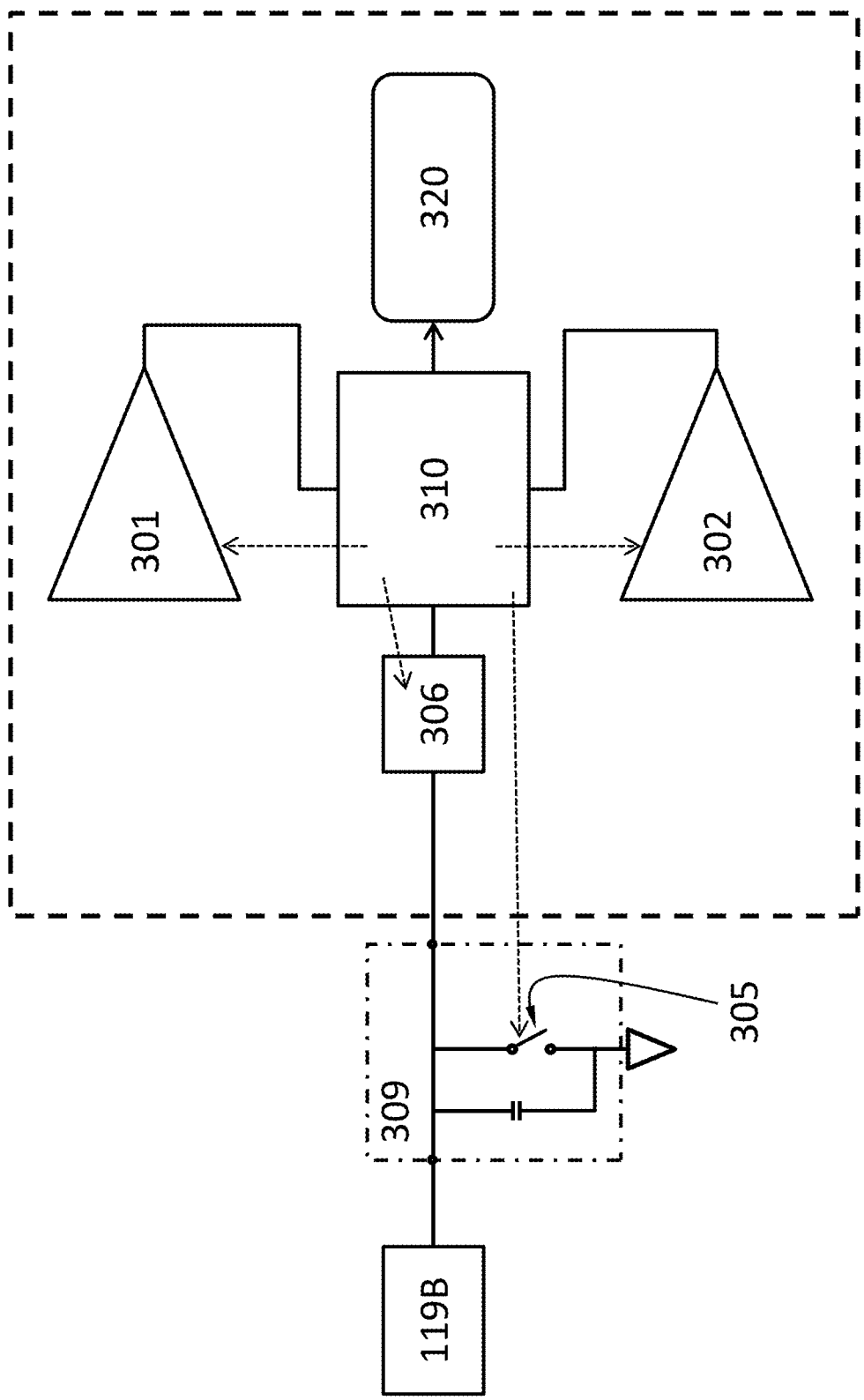

FIG. 7A and FIG. 7B each show a component diagram of the electronic system 121, according to an embodiment. The electronic system 121 may include a first voltage comparator 301, a second voltage comparator 302, a counter 320, a switch 305, a voltmeter 306 and a controller 310.

The first voltage comparator 301 is configured to compare the voltage of an electrode of a diode to a first threshold. The diode may be a diode formed by the first doped region 111, one of the discrete regions 114 of the second doped region 113, and the optional intrinsic region 112. Alternatively, the first voltage comparator 301 is configured to compare the voltage of an electrical contact (e.g., a discrete portion of electrical contact 119B) to a first threshold. The first voltage comparator 301 may be configured to monitor the voltage directly, or calculate the voltage by integrating an electric current flowing through the diode or electrical contact over a period of time. The first voltage comparator 301 may be controllably activated or deactivated by the controller 310. The first voltage comparator 301 may be a continuous comparator. Namely, the first voltage comparator 301 may be configured to be activated continuously, and monitor the voltage continuously. The first voltage comparator 301 configured as a continuous comparator reduces the chance that the electronic system 121 misses signals generated by an incident radiation photon. The first voltage comparator 301 configured as a continuous comparator is especially suitable when the incident radiation intensity is relatively high. The first voltage comparator 301 may be a clocked comparator, which has the benefit of lower power consumption. The first voltage comparator 301 configured as a clocked comparator may cause the electronic system 121 to miss signals generated by some incident radiation photons. When the incident radiation intensity is low, the chance of missing an incident radiation photon is low because the time interval between two successive photons is relatively long. Therefore, the first voltage comparator 301 configured as a clocked comparator is especially suitable when the incident radiation intensity is relatively low. The first threshold may be 5-10%, 10%-20%, 20-30%, 30-40% or 40-50% of the maximum voltage one incident radiation photon may generate in the diode or the resistor. The maximum voltage may depend on the energy of the incident radiation photon (i.e., the wavelength of the incident radiation), the material of the radiation absorption layer 110, and other factors. For example, the first threshold may be 50 mV, 100 mV, 150 mV, or 200 mV.

The second voltage comparator 302 is configured to compare the voltage to a second threshold. The second voltage comparator 302 may be configured to monitor the voltage directly, or calculate the voltage by integrating an electric current flowing through the diode or the electrical contact over a period of time. The second voltage comparator 302 may be a continuous comparator. The second voltage comparator 302 may be controllably activate or deactivated by the controller 310. When the second voltage comparator 302 is deactivated, the power consumption of the second voltage comparator 302 may be less than 1%, less than 5%, less than 10% or less than 20% of the power consumption when the second voltage comparator 302 is activated. The absolute value of the second threshold is greater than the absolute value of the first threshold. As used herein, the term "absolute value" or "modulus" |x| of a real number x is the non-negative value of x without regard to its sign. Namely, $$|x| = \begin{cases} x, \text{ if } x \geq 0 \\ -x, \text{ if } x \leq 0 \end{cases}.$$

The second threshold may be 200%-300% of the first threshold. The second threshold may be at least 50% of the maximum voltage one incident radiation photon may generate in the diode or resistor. For example, the second threshold may be 100 mV, 150 mV, 200 mV, 250 mV or 300 mV. The second voltage comparator 302 and the first voltage comparator 310 may be the same component. Namely, the system 121 may have one voltage comparator that can compare a voltage with two different thresholds at different times.

The first voltage comparator 301 or the second voltage comparator 302 may include one or more op-amps or any other suitable circuitry. The first voltage comparator 301 or the second voltage comparator 302 may have a high speed to allow the electronic system 121 to operate under a high flux of incident radiation. However, having a high speed is often at the cost of power consumption.

The counter 320 is configured to register a number of radiation photons reaching the diode or resistor. The counter 320 may be a software component (e.g., a number stored in a computer memory) or a hardware component (e.g., a 4017 IC and a 7490 IC).

The controller 310 may be a hardware component such as a microcontroller and a microprocessor. The controller 310 is configured to start a time delay from a time at which the first voltage comparator 301 determines that the absolute value of the voltage equals or exceeds the absolute value of the first threshold (e.g., the absolute value of the voltage increases from below the absolute value of the first threshold to a value equal to or above the absolute value of the first threshold). The absolute value is used here because the voltage may be negative or positive, depending on whether the voltage of the cathode or the anode of the diode or which electrical contact is used. The controller 310 may be configured to keep deactivated the second voltage comparator 302, the counter 320 and any other circuits the operation of the first voltage comparator 301 does not require, before the time at which the first voltage comparator 301 determines that the absolute value of the voltage equals or exceeds the absolute value of the first threshold. The time delay may expire before or after the voltage becomes stable, i.e., the rate of change of the voltage is substantially zero. The phase "the rate of change of the voltage is substantially zero" means that temporal change of the voltage is less than 0.1%/ns. The phase "the rate of change of the voltage is substantially non-zero" means that temporal change of the voltage is at least 0.1%/ns.

The controller 310 may be configured to activate the second voltage comparator during (including the beginning and the expiration) the time delay. In an embodiment, the controller 310 is configured to activate the second voltage comparator at the beginning of the time delay. The term "activate" means causing the component to enter an operational state (e.g., by sending a signal such as a voltage pulse or a logic level, by providing power, etc.). The term "deactivate" means causing the component to enter a non-operational state (e.g., by sending a signal such as a voltage pulse or a logic level, by cut off power, etc.). The operational state may have higher power consumption (e.g., 10 times higher, 100 times higher, 1000 times higher) than the non-operational state. The controller 310 itself may be deactivated until the output of the first voltage comparator 301 activates the controller 310 when the absolute value of the voltage equals or exceeds the absolute value of the first threshold.

The controller 310 may be configured to cause the number registered by the counter 320 to increase by one, if, during the time delay, the second voltage comparator 302 determines that the absolute value of the voltage equals or exceeds the absolute value of the second threshold.

The controller 310 may be configured to cause the voltmeter 306 to measure the voltage upon expiration of the time delay. The controller 310 may be configured to connect the electrode to an electrical ground, so as to reset the voltage and discharge any charge carriers accumulated on the electrode. In an embodiment, the electrode is connected to an electrical ground after the expiration of the time delay. In an embodiment, the electrode is connected to an electrical ground for a finite reset time period. The controller 310 may connect the electrode to the electrical ground by controlling the switch 305. The switch may be a transistor such as a field-effect transistor (FET).

In an embodiment, the system 121 has no analog filter network (e.g., a RC network). In an embodiment, the system 121 has no analog circuitry.

The voltmeter 306 may feed the voltage it measures to the controller 310 as an analog or digital signal.

The electronic system 121 may include a capacitor module 309 electrically connected to the electrode of the diode or the electrical contact, wherein the capacitor module is configured to collect charge carriers from the electrode. The capacitor module can include a capacitor in the feedback path of an amplifier. The amplifier configured as such is called a capacitive transimpedance amplifier (CTIA). CTIA has high dynamic range by keeping the amplifier from saturating and improves the signal-to-noise ratio by limiting the bandwidth in the signal path. Charge carriers from the electrode accumulate on the capacitor over a period of time ("integration period") (e.g., as shown in FIG. 4, between $t_0$ to $t_1$, or $t_1$-$t_2$). After the integration period has expired, the capacitor voltage is sampled and then reset by a reset switch. The capacitor module can include a capacitor directly connected to the electrode.

Figure 8:
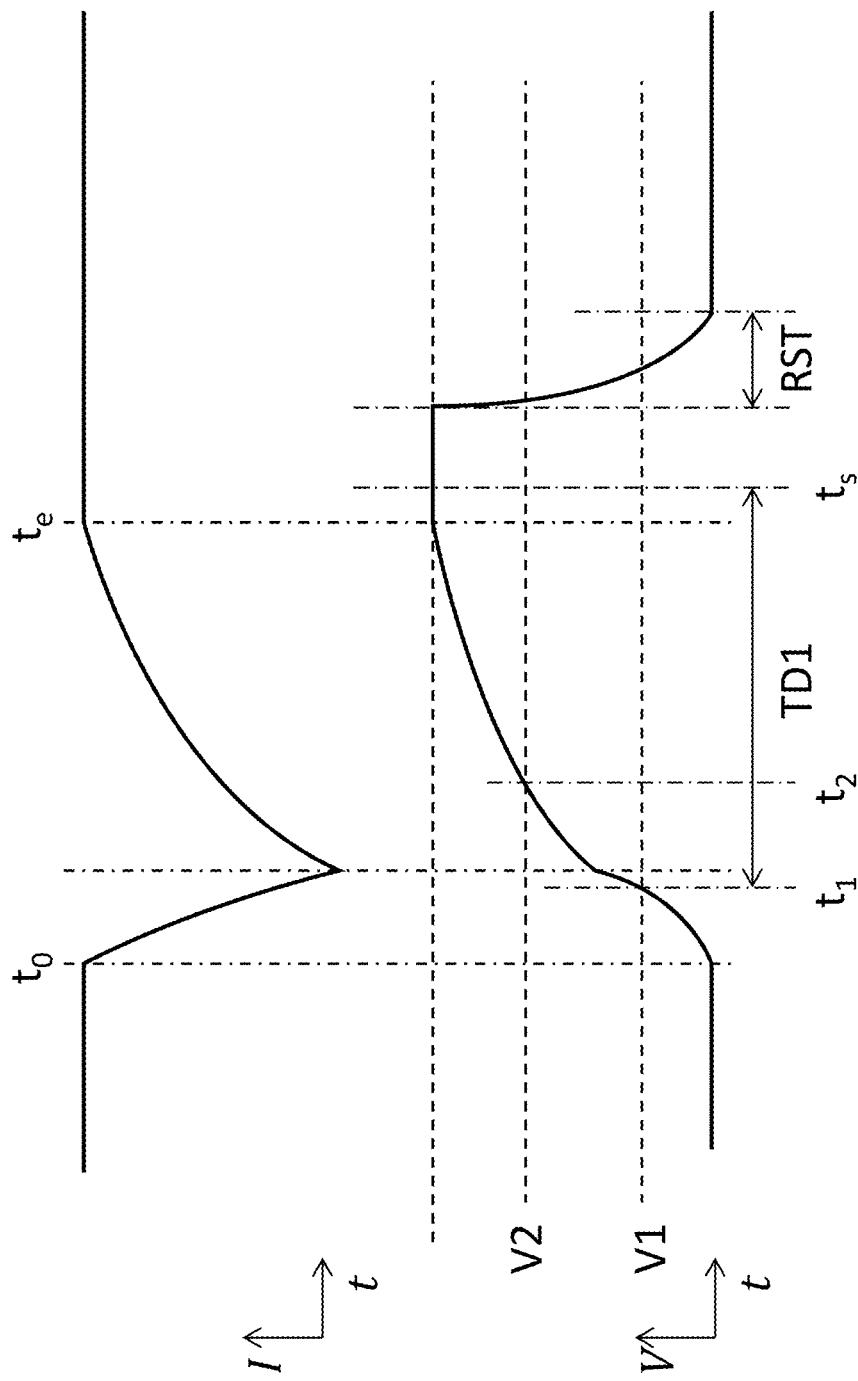
FIG. 8 schematically shows a temporal change of the voltage of the electrode or the electrical contact, according to an embodiment.

FIG. 8 schematically shows a temporal change of the electric current flowing through the electrode (upper curve) caused by charge carriers generated by a radiation photon incident on the diode or the resistor, and a corresponding temporal change of the voltage of the electrode (lower curve). The voltage may be an integral of the electric current with respect to time. At time $t_0$, the radiation photon hits the diode or the resistor, charge carriers start being generated in the diode or the resistor, electric current starts to flow through the electrode of the diode or the resistor, and the absolute value of the voltage of the electrode or electrical contact starts to increase. At time $t_1$, the first voltage comparator 301 determines that the absolute value of the voltage equals or exceeds the absolute value of the first threshold V1, and the controller 310 starts the time delay TD1 and the controller 310 may deactivate the first voltage comparator 301 at the beginning of TD1. If the controller 310 is deactivated before $t_1$, the controller 310 is activated at $t_1$. During TD1, the controller 310 activates the second voltage comparator 302. The term "during" a time delay as used here means the beginning and the expiration (i.e., the end) and any time in between. For example, the controller 310 may activate the second voltage comparator 302 at the expiration of TD1. If during TD1, the second voltage comparator 302 determines that the absolute value of the voltage equals or exceeds the absolute value of the second threshold at time $t_2$, the controller 310 causes the number registered by the counter 320 to increase by one. At time $t_e$, all charge carriers generated by the radiation photon drift out of the radiation absorption layer 110. At time $t_s$ the time delay TD1 expires. In the example of FIG. 8, time $t_s$ is after time $t_e$; namely TD1 expires after all charge carriers generated by the radiation photon drift out of the radiation absorption layer 110. The rate of change of the voltage is thus substantially zero at $t_s$. The controller 310 may be configured to deactivate the second voltage comparator 302 at expiration of TD1 or at $t_2$, or any time in between.

The controller 310 may be configured to cause the voltmeter 306 to measure the voltage upon expiration of the time delay TD1. In an embodiment, the controller 310 causes the voltmeter 306 to measure the voltage after the rate of change of the voltage becomes substantially zero after the expiration of the time delay TD1. The voltage at this moment is proportional to the amount of charge carriers generated by a radiation photon, which relates to the energy of the radiation photon. The controller 310 may be configured to determine the energy of the radiation photon based on voltage the voltmeter 306 measures. One way to determine the energy is by binning the voltage. The counter 320 may have a sub-counter for each bin. When the controller 310 determines that the energy of the radiation photon falls in a bin, the controller 310 may cause the number registered in the sub-counter for that bin to increase by one. Therefore, the electronic system 121 may be able to detect a radiation image and may be able to resolve radiation photon energies of each radiation photon.

After TD1 expires, the controller 310 connects the electrode to an electric ground for a reset period RST to allow charge carriers accumulated on the electrode to flow to the ground and reset the voltage. After RST, the electronic system 121 is ready to detect another incident radiation photon. Implicitly, the rate of incident radiation photons the electronic system 121 can handle in the example of FIG. 8 is limited by 1/(TD1+RST). If the first voltage comparator 301 has been deactivated, the controller 310 can activate it at any time before RST expires. If the controller 310 has been deactivated, it may be activated before RST expires.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A detector comprising:
 a radiation absorption layer comprising a first surface, a first electrical contact on the first surface, a second surface opposite the first surface, a second electrical contact on the second surface, and a sidewall;
 an electronics layer bonded to the radiation absorption layer, the electronics layer comprising an electronic system configured to process electrical signals on the second electrical contact;
 wherein the sidewall is doped;
 wherein the radiation absorption layer comprises a diode comprising a first doped region and a second doped region;
 wherein the first doped region and the second doped region are in the first surface and the second surface respectively;
 wherein the sidewall is joined with the first doped region.

2. The detector of claim 1, wherein the second electrical contact comprises discrete portions.

3. The detector of claim 1, wherein the sidewall is the only doped sidewall of the radiation absorption layer.

4. The detector of claim 1, wherein the second doped region comprises discrete regions.

5. The detector of claim 1, wherein the first doped region and the sidewall have a same type of doping.

6. The detector of claim 1, wherein the first doped region and the second doped region have opposite types of doping.

7. The detector of claim 1, wherein the electronic system comprises a voltage comparator configured to compare a voltage of the second electrical contact to a first threshold; a counter configured to register a number of photons of radiation absorbed by the radiation absorption layer; a controller; a voltmeter;
 wherein the controller is configured to start a time delay from a time at which the voltage comparator determines that an absolute value of the voltage equals or exceeds an absolute value of the first threshold;
 wherein the controller is configured to cause the voltmeter to measure the voltage upon expiration of the time delay;
 wherein the controller is configured to determine a number of photons by dividing the voltage measured by the voltmeter by a voltage that a single photon would have caused on the second electrical contact;
 wherein the controller is configured to cause the number registered by the counter to increase by the number of photons.

8. The detector of claim 7, wherein the controller is configured to deactivate the voltage comparator at a beginning of the time delay.

9. A system comprising:
 a first package comprising a first radiation detector, the first radiation detector being the detector of claim 1;
 wherein no sidewalls of the first radiation detector except the sidewall that is doped are configured to be exposed to radiation incident on the system.

10. The system of claim 9, further comprising a second package comprising a second radiation detector, wherein the second package is configured to prevent radiation from reaching a sidewall of the first radiation detector that is not doped.

11. The system of claim 9, wherein the first package is mounted to a system PCB and the first radiation detector is tilted relative to the system PCB.

12. The detector of claim 1, wherein the first electrical contact is in electrical contact with the sidewall.

* * * * *